(12) United States Patent
Shim et al.

(10) Patent No.: US 8,743,617 B2
(45) Date of Patent: Jun. 3, 2014

(54) NONVOLATILE MEMORY INCLUDING PLURAL MEMORY CELLS STACKED ON SUBSTRATE

(75) Inventors: Sang-Won Shim, Seoul (KR); Dong-Hun Kwak, Hwaseong-si (KR); Doosub Lee, Seoul (KR); Chiweon Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 206 days.

(21) Appl. No.: 13/429,899

(22) Filed: Mar. 26, 2012

(65) Prior Publication Data

US 2012/0300527 A1 Nov. 29, 2012

(30) Foreign Application Priority Data

May 25, 2011 (KR) .................. 10-2011-0049681

(51) Int. Cl.
*G11C 11/34* (2006.01)

(52) U.S. Cl.
USPC ............ 365/185.19; 365/185.18; 365/185.23; 365/189.09

(58) Field of Classification Search
USPC .............. 365/185.19, 185.18, 185.23, 189.09
See application file for complete search history.

(56) References Cited

U.S. PATENT DOCUMENTS

| 7,545,680 | B2 * | 6/2009 | Kim et al. | 365/185.23 |
|---|---|---|---|---|
| 7,813,184 | B2 * | 10/2010 | Kim et al. | 365/185.29 |
| 7,911,850 | B2 * | 3/2011 | Chae et al. | 365/185.23 |
| 7,983,084 | B2 | 7/2011 | Tokiwa et al. | |
| 2010/0097858 | A1 | 4/2010 | Tokiwa et al. | |
| 2011/0249498 | A1 | 10/2011 | Tokiwa et al. | |

FOREIGN PATENT DOCUMENTS

| JP | 2010-102755 A | 5/2010 |
|---|---|---|
| KR | 10-0673728 | 1/2007 |
| KR | 2007-0096681 A | 10/2007 |

* cited by examiner

*Primary Examiner* — Son Dinh
(74) *Attorney, Agent, or Firm* — Harness, Dickey & Pierce, P.L.C.

(57) ABSTRACT

According to example embodiments, a nonvolatile memory device includes a memory cell array including a plurality of memory cells stacked on a substrate, a plurality of word lines connected with the memory cell array, a plurality of pass voltage generators, and a voltage control circuit. The pass voltage generators each include a plurality of current paths and are configured to generate pass driving signals applied to unselected word lines of the plurality of word lines. The voltage control circuit is configured to control rising slopes of the pass driving signals generated from the plurality of pass voltage generators, based on adjusting the number of current paths in each pass voltage generator used to generate each driving signal.

20 Claims, 27 Drawing Sheets

NONVOLATILE MEMORY INCLUDING PLURAL MEMORY CELLS STACKED ON SUBSTRATE

CROSS-REFERENCE TO RELATED APPLICATIONS

This application claims priority under 35 U.S.C. §119 to Korean Patent Application No. 10-2011-0049681, filed May 25, 2011, the entire disclosure of which is incorporated by reference herein.

BACKGROUND

Example embodiments relate to a semiconductor memory, and more particularly, to a memory system including a nonvolatile memory.

A semiconductor memory device may be fabricated using semiconductors such as silicon (Si), germanium (Ge), gallium arsenide (GaAs), indium phosphide (InP), and the like. Semiconductor memory devices may be classified into volatile memory devices and nonvolatile memory devices.

The volatile memory devices may lose stored contents at power-off. The volatile memory devices may include a static RAM (SRAM), a dynamic RAM (DRAM), a synchronous DRAM (SDRAM), and the like. The nonvolatile memory devices may retain stored contents even at power-off. The nonvolatile memory devices may include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device may be roughly divided into a NOR type and a NAND type.

Semiconductor memory devices with a three-dimensional array structure are being developed to improve the integrity of the semiconductor memory device.

SUMMARY

Example embodiments relate to a semiconductor memory, and for example, to a memory system including a nonvolatile memory.

According to example embodiments of inventive concepts, a nonvolatile memory device contains a memory cell array including a plurality of memory cells stacked on a substrate, a plurality of word lines connected with the memory cell array a plurality of pass voltage generators, and voltage control circuit. The pass voltage generators each include a plurality of current paths and the pass voltage generators are each configured to generate pass driving signals applied to unselected word lines of the plurality of word lines. The voltage control circuit is configured to control rising slopes of the pass driving signals generated from the plurality of pass voltage generators, based on adjusting the number of current paths in each pass voltage generator used to generate each pass driving signal.

The voltage control circuit may be configured to adjust the number of current paths used to generate each of the pass driving signals such that the pass driving signals have the same rising slope.

The pass driving signals may have equal voltage levels when the pass driving signals are at a stabilization state.

The current paths included in each of the pass voltage generators may be connected in parallel.

The plurality of word lines may include a first word line and a second word line sequentially stacked on the substrate. The voltage control circuit may be configured to control the plurality of pass voltage generators so the number of current paths used to generate a pass driving signal of the second word line is more than the number of current paths used to generate a pass driving signal of the first word line when the first word line and the second word line are unselected word lines.

The plurality of word lines may include first to fourth word lines sequentially stacked on the substrate. The voltage control circuit may be configured to control the plurality of pass voltage generators so the number of current paths used to generate a pass driving signal of the second word line is more than the number of current paths used to generate a pass driving signal of the first word line, and the number of current paths used to generate a pass driving signal of the fourth word line is more than the number of current paths used to generate a pass driving signal of the third word line.

The voltage control circuit may be configured to transfer enable signals to the pass voltage generators, respectively. The current paths in each of the pass voltage generators may be connected in parallel between a first node receiving a source voltage and a second node. Each of the pass voltage generators may be configured to activate or inactivate the current paths according to enable signals received from the voltage control circuit. When currents flow via activated current paths in each pass voltage generator, each pass voltage generator is configured to transfer a voltage to the second node as one of the pass driving signals, respectively.

Each of the pass voltage generators may be configured to generate a first pass voltage signal applied to at least one of the unselected word lines at a program operation and a second pass voltage signal applied to at least one of the unselected word lines at a read operation. The voltage control circuit is configured to control rising slopes of the first and second pass voltage signals, based on adjusting the number of current paths used to generate each of the first and second pass voltage signals, and the number of current paths used to generate the first pass voltage signal may be less than the number of current paths used to generate the second pass voltage signal.

The nonvolatile memory device may further include a selection voltage generator configured to generate a select driving signal applied to a selected word line of the plurality of word lines; and a row selecting circuit configured to transfer an output signal of the selection voltage generator to the selected word line and to transfer output signals of the pass voltage generators to the unselected word lines, respectively.

According to example embodiments, a nonvolatile memory device contains a memory cell array including a plurality of memory cells stacked on a substrate, a plurality of word lines connected with the memory cell array, a pass voltage generator including a plurality of current paths, and a voltage control circuit. The pass voltage generator is configured to generate a first pass voltage signal applied to at least one unelected word line of the plurality of word lines at a program operation, and the pass voltage generator is configured to generate a second pass voltage signal applied to the at least one unselected word line of the plurality of word lines at a read operation. The voltage control circuit is configured to control rising slopes of the first and second pass voltage signals, based on adjusting the number of current paths used to generate the first and second pass voltage signals.

The voltage control circuit may be configured to control the pass voltage generator so the number of current paths used to generate the first pass voltage signal is less than the number of current paths used to generate the second pass voltage signal.

The nonvolatile memory device may further include a control logic configured to control the program operation and the read operation. The voltage control circuit may be configured to provide the pass voltage generator with a mode signal corresponding to one of the program and read operations. The voltage control circuit may generate the mode signal according to a control of the control logic.

The pass voltage generator may be configured to adjust the number of current paths used to generate each of the first and second pass voltage signals according to the mode signal.

The plurality current paths is connected in parallel between a first node and a second node, the pass voltage generator activates the parallel-connected current paths according to the mode signal, and the first node receives a source voltage and a voltage transferred to the second node when currents flow via activated current paths is provided as one of the first and second path voltage signals.

The nonvolatile memory device further comprises a selection voltage generator configured to generate a program voltage to be applied to a program voltage, the program operation includes a plurality of program loops and the program voltage increases stepwise at iteration of the program loops, and if a program loop number increases, the voltage control circuit controls the pass voltage generator such that the number of current paths used to generate the first pass voltage signal decreases.

According to example embodiments, a nonvolatile memory device includes at least one cell string containing first to $n^{th}$ memory cells stacked on a substrate, a plurality of word lines connected to the at least one cell string, a voltage generating circuit configured to apply pass driving signals to the first to $n^{th}$ memory cells of the at least one cell string via the plurality of word lines, and a voltage control circuit. The voltage generating circuit includes a plurality of pass voltage generators. Each pass voltage generator contains a plurality of current paths and is configured to generate at least one of the pass driving signals applied to the first to the $n^{th}$ memory cells. The voltage control circuit is configured to control rising slopes of the pass driving signals applied to the first the $n^{th}$ memory cells, based on adjusting the number of current paths in each pass voltage generator used to generate each pass driving signal.

The voltage control circuit may be configured to control the voltage generating circuit so a number of current paths used in one of the pass voltage generators to generate a pass driving signal applied to the first memory cell is less than a number of current paths used in another of the pass voltage generators to generate a pass driving signal applied to another of the first to nth memory cells of the at least one cell string The control circuit may be configured to provide a mode signal to the voltage generating circuit. The mode signal corresponds to one of a read operation and a program operation. Each pass voltage generator may be configured to generate a first pass driving signal when the mode signal corresponds to a read operation. Each pass voltage generator may be configured to generate a second pass driving signal when the mode signal corresponds to a program operation.

The voltage generating circuit may further include a selection voltage generator configured to generate a select driving signal applied to a selected word line of the plurality of word lines.

According to example embodiments, a memory system may include a control coupled to the nonvolatile memory device.

BRIEF DESCRIPTION OF THE FIGURES

The above and other objects and features will become apparent from the following description of non-limiting embodiments with reference to the following figures, wherein like reference numerals refer to like parts throughout the various figures unless otherwise specified. The drawings are not necessarily to scale, emphasis instead being placed upon illustrating the principles of inventive concepts. In the drawings.

DETAILED DESCRIPTION

Figure 1:
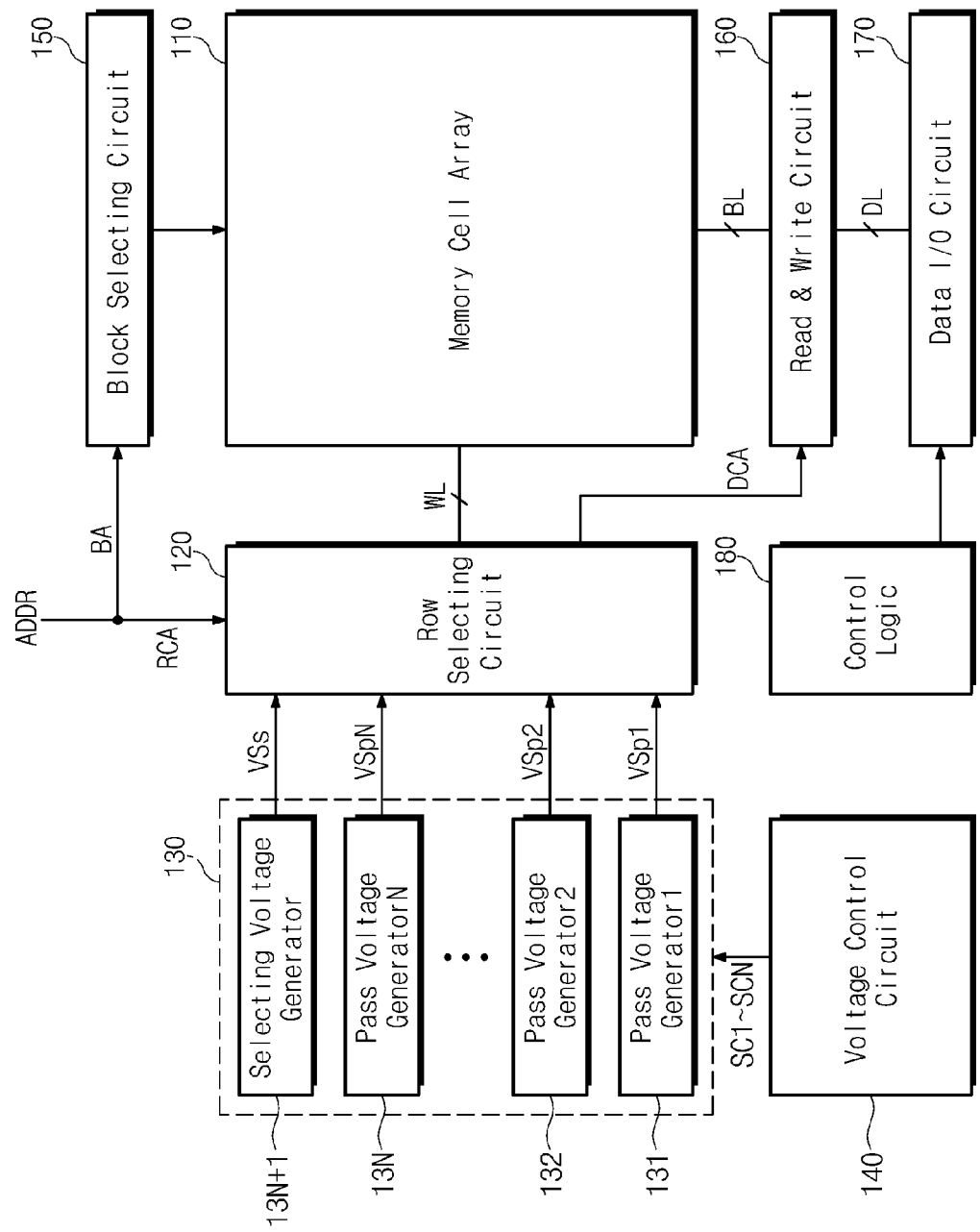
FIG. 1 is a block diagram of a nonvolatile memory according to example embodiments of inventive concepts.

Example embodiments will now be described more fully with reference to the accompanying drawings, in which some example embodiments are shown. Example embodiments may, however, be embodied in many different forms and should not be construed as limited to the embodiments set forth herein. Rather, these embodiments are provided so that this disclosure will be thorough and complete, and will fully convey the scope of example embodiments of inventive concepts to those skilled in the art. In the drawings, the size and relative sizes of layers and regions may be exaggerated for clarity. Like numbers refer to like elements throughout, and thus their description may be omitted.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

In a nonvolatile memory including a memory array with a three-dimensional structure, rising slopes of driving signals applied to word lines may differentiate due to process factors. The difference between rising slopes may cause overshooting of driving signals, the electric field coupling between adjacent memory cells, reduction of a read margin (e.g., a read fail), and the like.

A nonvolatile memory according to example embodiments of inventive concepts may be configured to generate a driving signal using a plurality of current paths connected in parallel. A rising slope of the driving signal may be controlled by adjusting the number of current paths being used. Below, example embodiments will be more fully described with reference to accompanying drawings.

FIG. 1 is a block diagram of a nonvolatile memory according to example embodiments of inventive concepts. Referring to FIG. 1, a nonvolatile memory 100 may include a memory cell array 110, a row selecting circuit 120, a voltage generating circuit 130, a voltage control circuit 140, a block selecting circuit 150, a read/write circuit 160, a data input/output circuit 170, and control logic 180.

The memory cell array 110 may be coupled with the row selecting circuit 120 via word lines WL and with the read/write circuit 160 via bit lines BL. The memory cell array 110 may include a plurality of memory cells. According to example embodiments, each memory cell may store one or more bits of data.

The row selecting circuit 120 may be coupled with the memory cell array 110 and the voltage generating circuit 130. The row selecting circuit 120 may receive a row and column address RCA in an address ADDR.

The row selecting circuit 120 may receive a selection voltage signal VSs and pass voltage signals VSp1 to VSpN from the voltage generating circuit 130. The voltage generating circuit 130 may provide the selection voltage signal VSs to a word line selected according to a row address in the row and column address RCA. The voltage generating circuit 130 may provide the pass voltage signals VSp1 to VSpN to unselected word lines.

A voltage level of a pass voltage signal at a program operation may be different from that at a read operation. A voltage level of a selection voltage signal at a read operation may be different from that at a program operation. In FIGS. 1 to 13, the nonvolatile memory will be described using a program operation, for ease of description. However, example embodiments are not limited thereto. For example, example embodiments of inventive concepts may be applied to a read operation.

The row selecting circuit 120 may be configured to decode a column address in the row and column address RCA. The row selecting circuit 120 may provide the decoded column address DCA to the read/write circuit 160.

The voltage generating circuit 130 may boost a power supply voltage supplied to the nonvolatile memory 100 to generate the selection voltage signal VSs and the pass voltage signals VSp1 to VSpN using the boosted voltage. The selection voltage signal VSs and the pass voltage signals VSp1 to VSpN may be transferred to the row selecting circuit 120. The voltage generating circuit 130 may operate responsive to the control of the voltage control circuit 140.

The voltage generating circuit 130 may include a plurality of pass voltage generators 131 to 13N and a selection voltage generator 13N+1. The pass voltage generators 131 to 13N may be configured to generate the pass voltage signals VSp1 to VSpN, respectively. The selection voltage generator 13N+1 may be configured to generate the selection voltage signal VSs. According to example embodiments, the selection voltage generator 13N+1 may generate the selection voltage signal VSs by boosting a power supply voltage supplied to the nonvolatile memory 100. According to example embodiments, the selection voltage generator 13N+1 may boost the power supply voltage using a plurality of pumping capacitors.

When the pass voltage signals VSp1 to VSpN are applied to word lines, respectively, their voltage levels may increase by lapse of time and may then reach a pass voltage level. The pass voltage level may mean a voltage level of the pass voltage signal when the pass voltage signal increases and then reaches its stabilization state. For example, a pass voltage level at a program operation may be different from that at a read operation. The pass voltage signals VSp1 to VSpN may have the same pass voltage level at a stabilization state.

According to example embodiments, the number of pass voltage generators 131 to 13N may be identical to that of word lines WL in a memory block, for example. The pass voltage generators 131 to 13N may correspond to word lines, respectively. Unselected word lines may be supplied with pass voltage signals of corresponding pass voltage generators, and a selected word line may be supplied with the selection voltage signal VSs, not a pass voltage signal of a corresponding pass voltage generator.

According to example embodiments, the number of pass voltage generators 131 to 13N may be less than that of word lines WL. In this case, word lines may be divided into a plurality of word line groups each corresponding to the pass voltage generators. The selection voltage signal VSs of the selection voltage generator 13N+1 may be supplied to a selected word line. Unselected word lines in each word line group may be supplied with pass voltage signals of pass voltage generators corresponding to each word line group.

The pass voltage generators 131 to 13N may include a plurality of current paths being connected in parallel, respectively. The pass voltage generators 131 to 13N may receive slope control signals SC1 to SCN, respectively. Current paths in each pass voltage generator may be activated or inactivated according the slope control signals SC1 to SCN, and a pass voltage signal of each of the pass voltage generators 131 to 13N may be generated using the activated current paths.

Pass voltage levels of pass voltage signals VSp1 to VSpN may be identical to one another. According to example embodiments of inventive concepts, the number of current paths being used to generate a pass voltage signal of each pass voltage generator may be controlled such that the pass voltage signals VSp1 to VSpN have the same rising slope. Accordingly, the pass voltage signals VSp1 to VSpN may reach a stabilization state at the same time.

The voltage control circuit 140 may be coupled with the voltage generating circuit 130. The voltage control circuit 140 may be configured to transfer the slope control signals SC1 to SCN to the pass voltage generators 131 to 13N, respectively. The number of current paths being used in each pass voltage generator may be controlled according to an input slope control signal. Rising slopes of the pass voltage signals VSp1 to VSpN may be controlled by adjusting the number of current paths.

The block selecting circuit 150 may receive a block address BA of the address ADDR. The block selecting circuit 150 may decode the block address BA to select at least one memory block in the memory cell array 110 according to the decoded block address.

The read/write circuit 160 may be coupled with the memory cell array 110 via bit lines BL and with the data input/output circuit 170 via data lines DL. The read/write circuit 160 may be configured to exchange data with the data input/output circuit 170. At programming, the read/write circuit 160 may receive data from the data input/output circuit 170 to write it in the memory cell array 110. At reading, the read/write circuit 160 may read data from the memory cell array 110 to transfer it to the data input/output circuit 170. According to example embodiments, the read/write circuit 160 may include a page buffer (or, a page register) performing reading and writing of data, a column selecting circuit selecting bit lines BL, and the like.

The data input/output circuit 170 may be coupled with the read/write circuit 160 via the data lines DL. The data input/output circuit 170 may be configured to exchange data with an external device. At programming, the data input/output circuit 170 may transfer data provided from the external device into the read/write circuit 160 via the data lines DL. At reading, the data input/output circuit 170 may output data transferred from the read/write circuit 160 via the data lines DL to the external device. According to example embodiments, the data input/output circuit 170 may include constituent elements such as a data buffer and the like.

The control logic 180 may be configured to control an overall operation of the nonvolatile memory 100. The control logic 180 may control the row selecting circuit 120, voltage generating circuit 130, voltage control circuit 140, block selecting circuit 150, read/write circuit 160, and input/output circuit 170. That is, the elements row selecting circuit 120, voltage generating circuit 130, voltage control circuit 140, block selecting circuit 150, read/write circuit 160, and input/output circuit 170 may operate responsive to the control of the control logic 180.

The voltage generating circuit 130 may generate pass voltage signals VSp1 to VSpN having the same rising slope. Accordingly, it is possible to limit (and/or prevent) overshooting of driving signals, the electric field coupling between adjacent memory cells, reduction of a read margin (i.e., a read fail), and the like. This means that the reliability of the nonvolatile memory 100 is improved.

Figure 2:
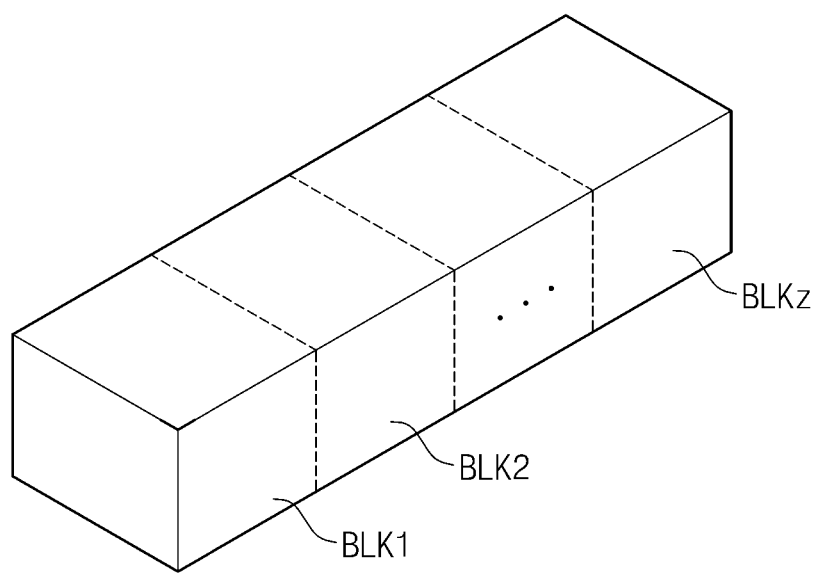
FIG. 2 is a diagram illustrating a memory cell array in FIG. 1.
Figure 2:
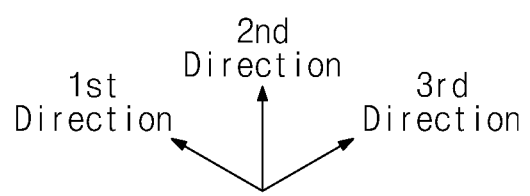

FIG. 2 is a diagram illustrating a memory cell array in FIG. 1. Referring to FIG. 2, a memory cell array 110 may include a plurality of memory blocks BLK1 to BLKz. Each of the memory blocks BLK1 to BLKz may be formed to have a three-dimensional structure (or, a vertical structure). For example, each of the memory blocks BLK1 to BLKz may include structures extending along the first to third directions. For example, each of the memory blocks BLK1 to BLKz may include a plurality of cell strings extending along the second direction. A plurality of cell strings may be provided to be arranged along the first and third directions.

Figure 6:
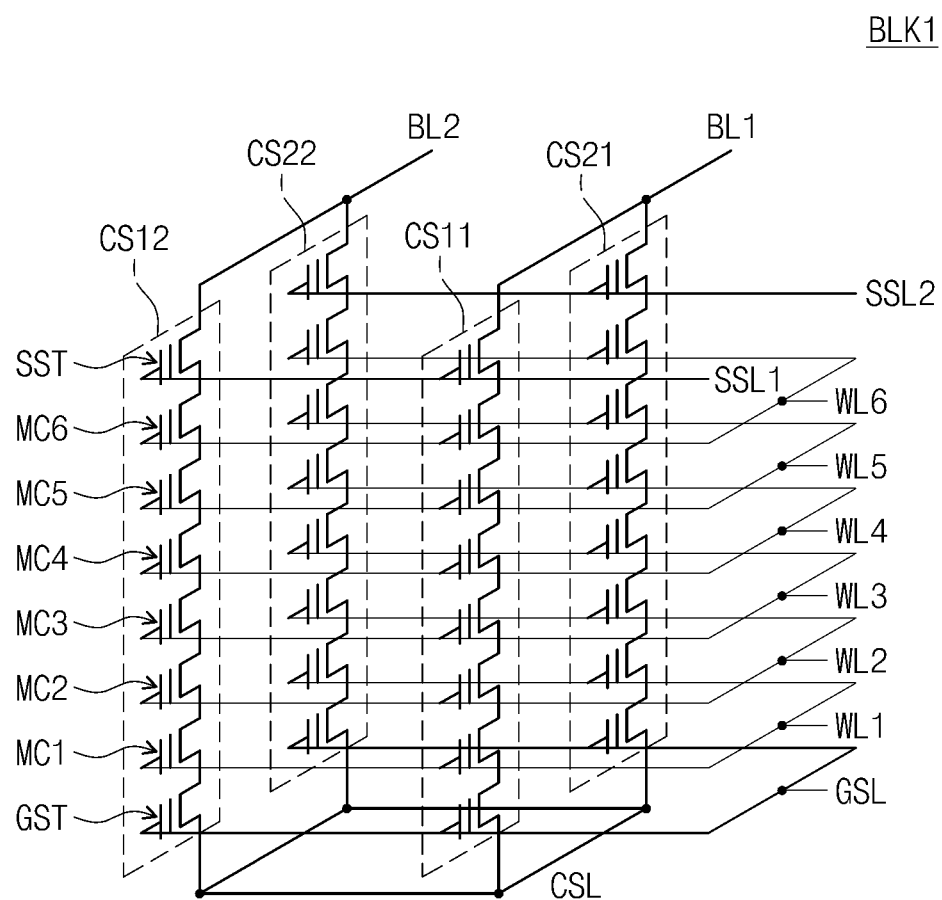
FIG. 6 is a circuit diagram illustrating an equivalent circuit of a memory block.

FIG. 6 is a circuit diagram illustrating an equivalent circuit of a memory block. Referring to FIG. 6, each of the memory blocks BLK1 to BLKz may be connected with a plurality of bit lines BL, a plurality of string selection lines SSL, a ground selection line GSL, a plurality of word lines WL, and a common source line CSL. The memory blocks BLK1 to BLKz will be more fully described with reference to FIG. 3.

According to example embodiments, the memory blocks BLK1 to BLKz may be selected by a block selecting circuit 150 in FIG. 1. For example, the block selecting circuit 150 may be configured to select a memory block BLKi (i=1 to z) corresponding to a decoded block address among the memory blocks BLK1 to BLKz.

Figure 3:
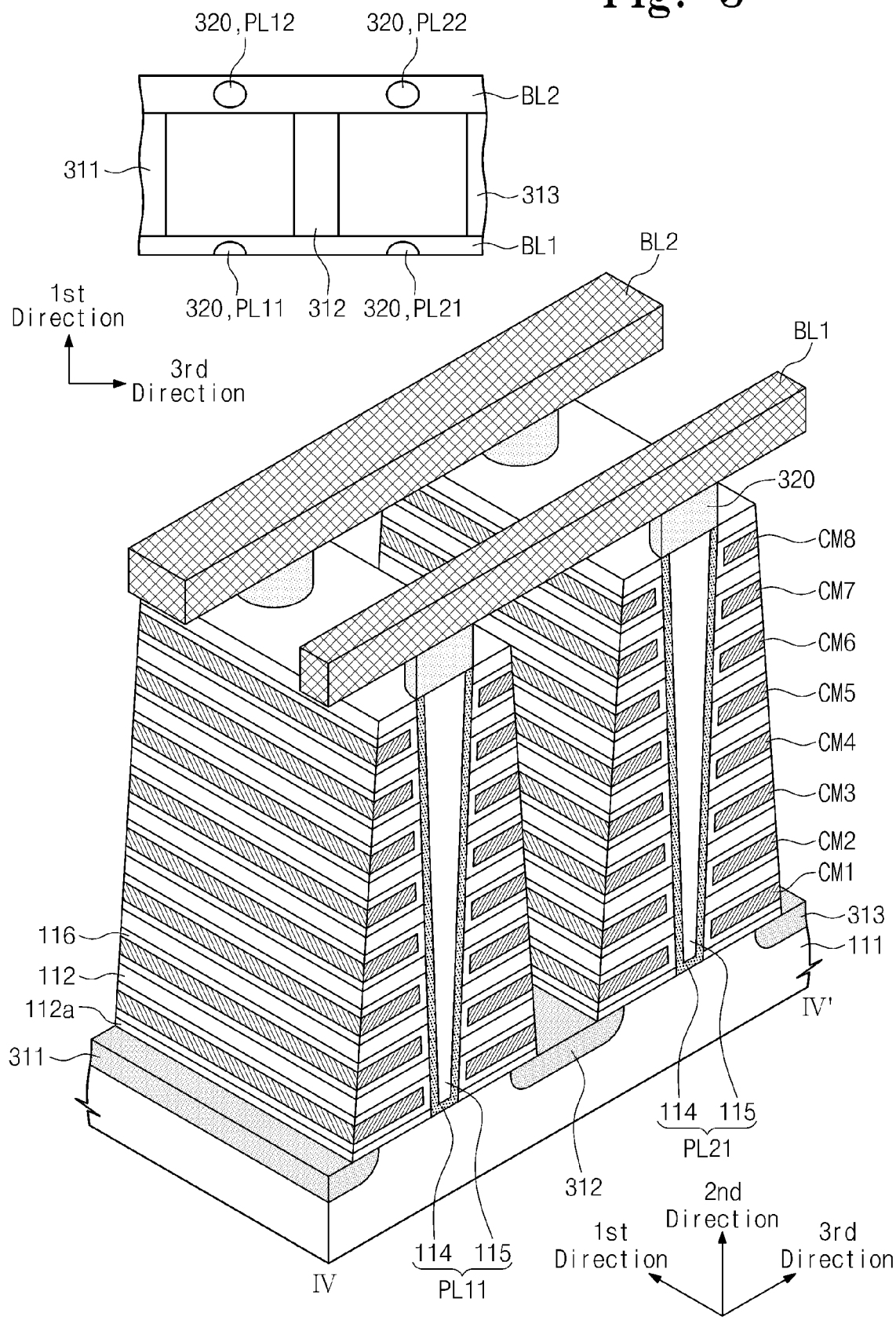
FIG. 3 is a perspective view of one of memory blocks in FIG. 2.
Figure 4:
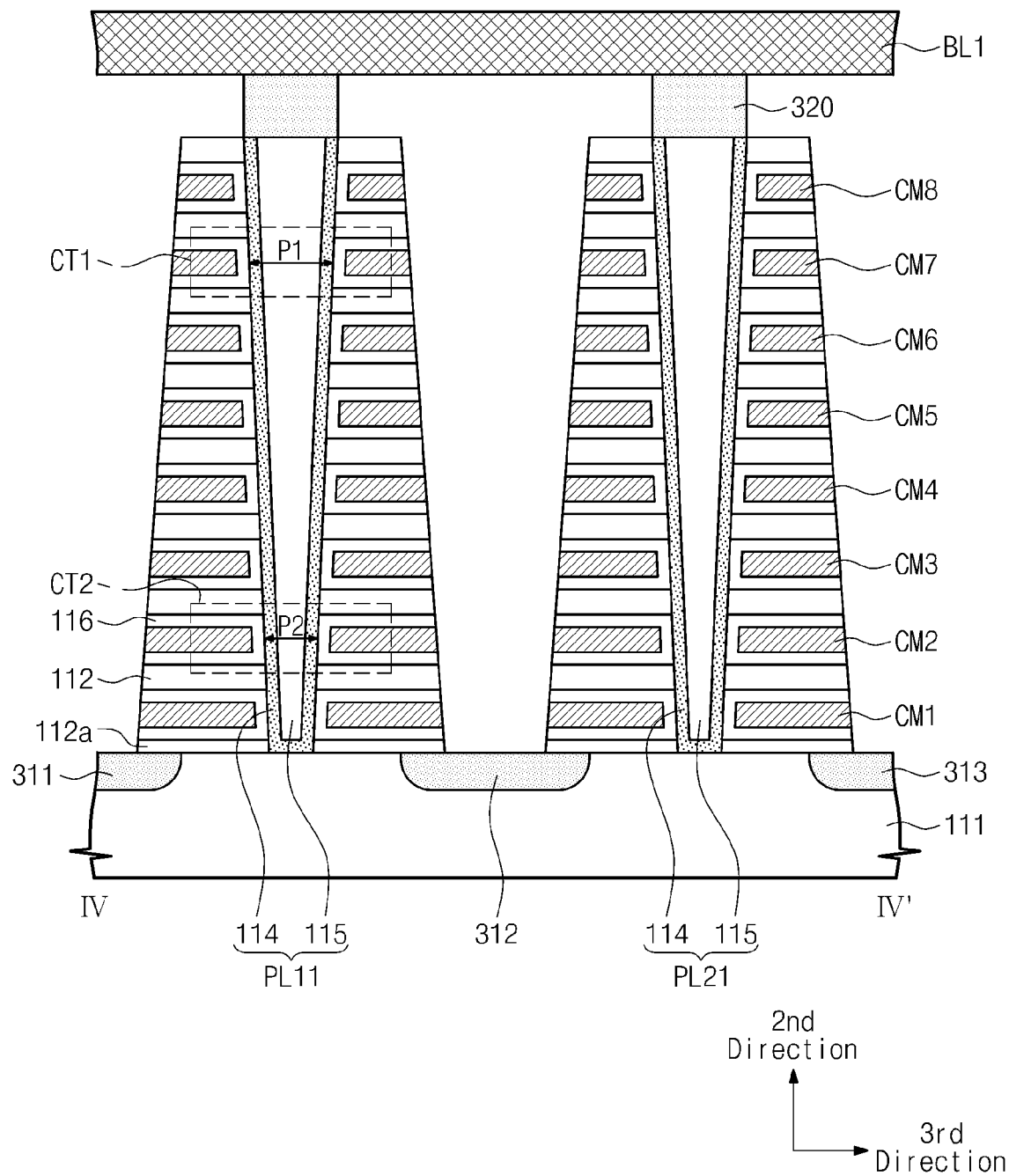
FIG. 4 is a cross-sectional view taken along a line IV-IV' in FIG. 3.

FIG. 3 is a perspective view of one of memory blocks in FIG. 2. FIG. 4 is a cross-sectional view taken along a line IV-IV' in FIG. 3.

A substrate 111 may be provided. The substrate 111 may be a well having a first conductive type, for example. The substrate 111 may be a p-well in which the Group III element such as boron is injected. The substrate 111 may be a pocket p-well which is provided within an n-well. Below, it is assumed that the substrate 111 is a p-well (or, a pocket p-well). However, the substrate 111 is not limited to a p-type.

A plurality of doping regions 311 to 313 extending along the first direction may be provided in the substrate 111. The doping regions 311 to 313 may be spaced apart from one another along the third direction. The doping regions 311 to 313 illustrated in FIGS. 3 and 4 may be defined as the first doping region 311, the second doping region 312, and the third doping region 313.

The first to third doping regions 311 to 313 may have a second conductive type different from that of the substrate 111. For example, the first to third doping regions 311 to 313 may be an n-type. Below, it is assumed that the first to third doping regions 311 to 313 are the n-type. However, the first to third doping regions 311 to 313 are not limited to the n-type.

Between two adjacent doping regions of the first to third doping regions 311 to 313, a plurality of insulation materials 112 and 112a may be provided sequentially on the substrate 111 along the second direction (i.e., a direction perpendicular to the substrate 111). The insulation materials 112 and 112a may be spaced apart along the second direction. The insulation materials 112 and 112a may extend along the first direction. For example, the insulation materials 112 and 112a may include an insulation material such as a silicon oxide film; however, example embodiments are not limited thereto. A thickness of the insulation material 112a contacting with the substrate 111 may be thinner than that of the insulation material 112.

Between two adjacent doping regions of the first to third doping regions 311 to 313, a plurality of pillars PL11, PL12, PL21, and PL22 may be arranged sequentially along the first direction so as to penetrate the plurality of insulation materials 112 and 112a along the second direction. For example, the pillars PL11, PL12, PL21, and PL22 may contact with the substrate 111 through the insulation materials 112 and 112a. A width of each of the pillars PL11, PL12, PL21, and PL22 may vary in proportion to a distance from the substrate 111. For example, the closer to the substrate, the narrower a width of each of the pillars PL11, PL12, PL21, and PL22.

The pillars PL11, PL12, PL21, and PL22 may be formed of multiple layers, respectively. Each of the pillars PL11, PL12, PL21, and PL22 may include a channel film 114 and an inner material 115. In the pillars PL11, PL12, PL21, and PL22, an inner material and a channel film surrounding the inner material may be provided.

The channel films 114 may include a semiconductor material (e.g., silicon) having a first conductive type. For example, the channel films 114 may include a semiconductor material (e.g., silicon) having the same type as the substrate 111. Below, it is assumed that the channel films 114 include p-type silicon. However, the channel films 114 are not limited to the p-type silicon. For example, the channel films 114 can include an intrinsic semiconductor that is a nonconductor.

The inner materials 115 may include an insulation material. For example, the inner materials 115 may include an insulation material such as silicon oxide. Alternatively, the inner materials 115 may include air gap. However, example embodiments are not limited thereto.

Between two adjacent doping regions of the first to third doping regions 311 to 313, information storage films 116 may be provided on exposed surfaces of the insulation materials 112 and 112a and the pillars PL11, PL12, PL21, and PL22. In FIG. 4, for example, a thickness of each of the information storage films 116 may be less than a distance between the insulation materials 112 and 112a. The closer to the substrate, the narrower a width of each of the semiconductor pillars PL11, PL12, PL21, and PL22.

Between two adjacent doping regions of the first to third doping regions 311 to 313, conductive materials CM1 to CM8 may be provided between the information storage films 116. The conductive materials CM1 to CM8 may include a metallic conductive material. Alternatively, the conductive materials CM1 to CM8 may include a nonmetallic conductive material such as polysilicon.

According to example embodiments, an information storage film 116 provided on an upper surface of an insulation material placed at the uppermost layer among the insulation materials 112 and 112a can be removed. According to example embodiments, an information storage film provided at a side opposite to the pillars PL11, PL12, PL21, and PL22 among the insulation materials 112 and 112a can be removed.

A plurality of drains 320 may be provided on the plurality of pillars PL11, PL12, PL21, and PL22, respectively. The drains 320 may include a semiconductor material (e.g., silicon) having the second conductive type, for example. The drains 320 may include an n-type semiconductor material (e.g., silicon). Below, it is assumed that the drains 320 include n-type silicon. However, example embodiments are not limited thereto.

Bit lines BL1 and BL2 extending in the third direction may be provided on the drains 320 so as to be spaced apart from one another along the first direction. The bit lines BL1 and BL2 may be coupled with the drains 320. According to example embodiments, the drains 320 and the bit lines BL1 and BL2 may be connected via contact plugs (not shown). The bit lines BL1 and BL2 may include a metallic conductive material. Alternatively, the bit lines BL1 and BL2 may include a nonmetallic conductive material such as polysilicon.

Below, rows and columns of the pillars PL11, PL12, PL21, and PL22 of a memory block BLK1 will be described in further detail. Pillars PL11 and PL12 coupled with conductive materials CM1 to CM8 between the first doping region 311 and the second doping region 312 via the information storage films 115 may be defined as the first row of pillars. Pillars PL21 and PL22 coupled with conductive materials CM1 to CM8 between the second doping region 312 and the third doping region 313 via the information storage films 115 may be defined as the second row of pillars. That is, a row direction means the first direction. Columns of pillars PL11, PL12, PL21, and PL22 may be defined according to the bit lines BL1 and BL2. Pillars PL11 and PL21 connected with the bit line BL1 via the drains 320 may be defined as the first column of semiconductor pillars. Pillars PL12 and PL22 connected with the bit line BL2 via the drains 320 may be defined as the second column of pillars. That is, a column direction means the third direction.

Below, heights of the conductive materials CM1 to CM8 may be defined. The conductive materials CM1 to CM8 may have the first to eighth heights according to a distance from the substrate 111. The conductive material CM1 closest to the substrate 111 may have the first height, and the conductive material CM8 closest to the bit lines BL1 and BL2 may have the eighth height.

Each of the pillars PL11, PL12, PL21, and PL22 may constitute a cell string with an adjacent information storage film 116 and an adjacent conductive material CMj (j=1 to 8). That is, the pillars PL11, PL12, PL21, and PL22 may form cell strings with information storage films 116 and the conductive materials CM1 to CM8.

Each cell string may include a plurality of cell transistors stacked in a direction perpendicular to the substrate.

Figure 5:
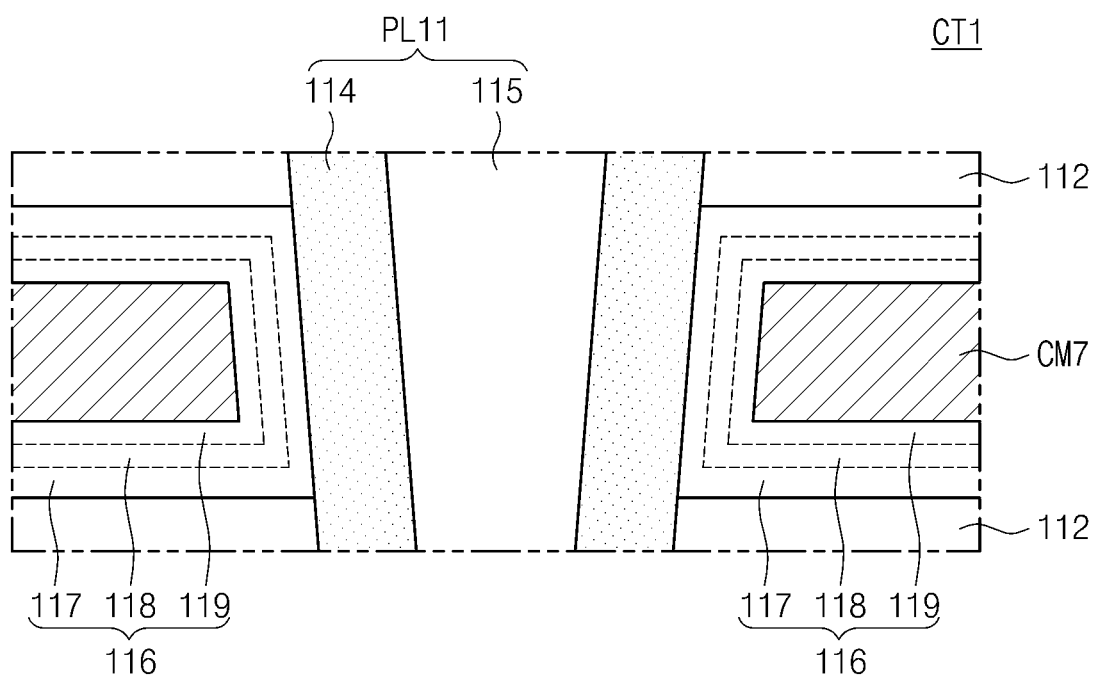
FIG. 5 is a diagram illustrating one of cell transistors in FIG. 4.

FIG. 5 is a diagram illustrating one of the cell transistors in FIG. 4. For example, the first cell transistor CT1 having the seventh height among a plurality of cell transistors is illustrated in FIG. 5. The first cell transistor CT1 may correspond to a pillar PL11 arranged in the first row and the first column.

Referring to FIGS. 4 and 5, the first cell transistor CT1 may be formed of the seventh conductive material CM7, a portion of the pillar PL11 adjacent to the seventh conductive material CM7, and an information storage film provided between the conductive material CM7 and the pillar PL11.

The information storage films 116 may extend to upper surfaces and lower surfaces of conductive materials CM1 to CM8 from regions between the conductive materials CM1 to CM8 and the pillars PL11, PL12, PL21, and PL22. Each of the information storage films 116 may include the first to third sub insulation films 117, 118, and 119.

The channel films 114 of the pillars PL11, PL12, PL21, and PL22 may include the same p-type silicon as the substrate 111. The channel films 114 may be formed in a direction perpendicular to the substrate 111. Accordingly, the channel films 114 of the pillars PL11, PL12, PL21, and PL22 may act as a vertical body. Channels formed at the channel films 114 of the pillars PL11, PL12, PL21, and PL22 may be vertical channels.

The plurality of conductive materials CM1 to CM8 may act as a gate (or, a control gate).

The first sub insulation films 117 adjacent to the pillars PL11, PL12, PL21, and PL22 may act as a tunneling insulation film. For example, the first sub insulation films 117 adjacent to the pillars PL11, PL12, PL21, and PL22 may include a dielectric film, for example a thermal oxide film. The first sub insulation films 117 may include a silicon oxide film.

The second sub insulation films 118 may act as a charge storage film. For example, the second sub insulation films 118 may act as a charge trap film. For example, the second sub insulation films 118 may include a nitride film or a metal oxide film (e.g., an aluminum oxide film, a hafnium oxide film, etc.). The second sub insulation films 118 may include a silicon nitride film.

The third sub insulation films 119 adjacent to the conductive materials CM1 to CM8 may act as a blocking insulation film. According to example embodiments, the third sub insulation films 119 may be formed of a single layer or multiple layers. The third sub insulation films 119 may be a high dielectric film (e.g., an aluminum oxide film, a hafnium oxide film, etc.) having a dielectric constant larger than the first and second sub insulation films 117 and 118. The third sub insulation films 119 may include a silicon oxide film.

According to example embodiments, the first to third sub insulation films 117 to 119 may constitute ONO (oxide-nitride-oxide).

The plurality of conductive materials CM1 to CM8 acting as a gate (or, a control gate), the third sub insulation films 119 acting as a block insulation film, the second sub insulation films 118 acting as a charge storage film, the first sub insulation films 117 acting as a tunneling insulation film, and the channel films 114 acting as a vertical body may operate as cell transistors CT. For example, the cell transistors CT may be a charge trap type cell transistor.

The cell transistors CT can be used for different purposes according to heights. For example, among the cell transistors CT, at least one cell transistor placed at the uppermost may be used as a string selection transistor SST. At least one cell transistor placed at the lowermost may be used as a ground selection transistor GST. The remaining cell transistors may be used as a memory cell.

The conductive materials CM1 to CM8 may extend along a row direction (or, the first direction) and may be connected with the plurality of pillars PL11, PL12, PL21, and PL22. That is, the conductive materials CM1 to CM8 may constitute conductive lines interconnecting cell transistors CT of the semiconductor pillars (PL11 and PL12) or (PL21 and PL22) in the same row.

According to example embodiments, the conductive materials CM1 to CM8 may be used as a string selection line SSL, a ground selection line GSL, or a word line WL according to the heights.

FIG. 6 is a circuit diagram illustrating an equivalent circuit of a memory block. Referring to FIGS. 3 to 6, cell strings CS11 and CS21 may be provided between the first bit line BL1 and a common source line CSL, and cell strings CS12 and CS22 may be provided between the second bit line BL2 and the common source line CSL. The cell transistors CS11, CS21, CS12, and CS22 may correspond to pillars PL11, PL21, PL12, and PL22, respectively.

The pillar PL11 in the first row and the first column may form the cell string CS11 in the first row and the first column together with conductive materials CM1 to CM8 and information storage films 116. The pillar PL12 in the first row and the second column may form the cell string CS12 in the first row and the second column together with the conductive materials CM1 to CM8 and the information storage films 116. The pillar PL21 in the second row and the first column may form the cell string CS21 in the second row and the first column together with the conductive materials CM1 to CM8 and the information storage films 116. The pillar PL22 in the second row and the second column may form the cell string CS22 in the second row and the second column together with the conductive materials CM1 to CM8 and the information storage films 116.

In the cell strings CS11, CS21, CS12, and CS22, cell transistors of the first height may act as a ground selection transistor GST. For example, the first conductive materials CM1 may be interconnected to form a ground selection line GSL. In the cell strings CS11, CS21, CS12, and CS22, cell transistors of the eighth height may act as a string selection transistor SST. The string selection transistors SST may be connected with the first and second string selection lines SSL1 and SSL2.

Cell strings in the same row may share a string selection line. Cell strings in different rows may be connected with different string selection lines, respectively. The first and second string selection lines SSL1 and SSL2 may correspond to the eighth conductive materials CM8, respectively. That is, it is understood that the pillars PL11, PL12, PL21, and PL22, that is, rows of the cell strings CS11, CS12, CS21, and CS22 are defined by the first and second string selection lines SSL1 and SSL2.

According to example embodiments, the first conductive materials CM1 may be interconnected to form a ground selection line GSL. The first word line WL1 may be formed by connecting the second conductive materials CM2 in common. The third conductive materials CM3 may be interconnected to form the second word line WL2. The fourth conductive materials CM4 may be interconnected to form the third word line WL3. The fourth word line WL4 may be formed by interconnecting the fifth conductive materials CM5. The sixth conductive materials CM6 may be interconnected to form the fifth word line WL5. The seventh conductive materials CM7 may be interconnected to form the sixth word line WL6.

The common source line CSL may be connected in common with the cell strings CS11, CS12, CS21, and CS22. For example, the common source line CSL may be formed by interconnecting the first to third doping regions 311 to 313.

As described above, the string selection lines SSL1 and SSL2, the word lines WL1 to WL6, and the ground selection line GSL of a selected memory block may be connected with a row selecting circuit 120 under the control of a block selecting circuit 150. The row selecting circuit 120 may select the string selection lines SSL1 and SSL2, the word lines WL1 to WL6, and the ground selection line GSL of the selected memory block.

Memory cells of the same height may be connected in common with a word line. Accordingly, when a word line of a specific height is selected, all cell strings CS11, CS12, CS21, and CS22 connected with the selected word line may be selected.

Cell strings of different rows may be connected with different string selection lines, respectively. Accordingly, cell strings (CS11 and CS12) or (CS21 and CS22) of an unselected row among cell strings CS11, CS12, CS21, and CS22 connected with the same word line may be electrically separated from the bit lines BL1 and BL2 by selecting and unselecting the first and second string selection lines SSL1 and SSL2. Cell strings (CS21 and CS22) or (CS11 and CS12) of a selected row may be electrically connected with the bit lines BL1 and BL2.

That is, rows of the cell strings CS11, CS12, CS21, and CS22 may be selected by selecting and unselecting the first and second string selection lines SSL1 and SSL2. Columns of cell strings in the selected row may be selected by selecting the bit lines BL1 and BL2.

A program operation and a read operation may be carried out by the page. That is, in cell strings connected with the same string selection line, memory cells connected with the same word line may be programmed at the same time. Further, in cell strings connected with the same string selection line, memory cells connected with the same word line may be read at the same time. At programming and reading, an address ADDR input from an external device may correspond to a specific page.

An erase operation may be performed by the memory block. Memory cells included in a memory block are erased at the same time. At erasing, an address ADDR input from an external device may correspond to a memory block.

String selection lines SSL1 and SSL2, word lines WL1 to WL6, and a ground selection line GSL of unselected memory blocks may be electrically separated from the row selecting circuit 120 under the control of the block selecting circuit 150. According to example embodiments, the row selecting circuit 120 may supply a low voltage (e.g., a ground voltage) to the string selection lines SSL1 and SSL2 and the ground selection line GSL of the unselected memory blocks. Accordingly, when string selection transistors SST and ground selection transistors GST of the unselected memory blocks may be turned off, the unselected memory blocks may be electrically separated from the bit lines BL1 and BL2 and the common source line CSL.

The closer to the substrate 111, the narrower widths (or, an area taken in the first to third directions) of the pillars PL11, PL12, PL21, and PL22. For example, a pillar width may vary due to a process characteristic or error.

According to example embodiments, each of the pillars PL11, PL12, PL21, and PL22 may be formed by providing materials such as silicon and insulation materials in a hole formed by etching. The deeper an etched depth, the narrower a width of a hole formed by etching. That is, the closer to the substrate 111, the narrower the width of each of the pillars PL11, PL12, PL21, and PL22. Referring to FIG. 4, a width P1 of a pillar PL11 corresponding to the seventh height may be wider than that P2 of the pillar PL11 corresponding to the second height.

In FIGS. 3 to 6, the memory block BLK1 is assumed to have the first height to the eighth height and to include 2×2 cell strings. However, the number of cell strings disposed in a column direction may be proportional to a height of the memory block BLK1. According to example embodiments, if the memory block BLK1 has the first to eighth heights, it may include 1×8 cell strings. At this time, the memory block BLK1 may be connected with eight string selection lines and a ground selection line. If the memory block BLK1 has the first to sixteenth heights, it may include 1×16 cell strings. At this time, the memory block BLK1 may be connected with 16 string selection lines and a ground selection line.

Figure 7:
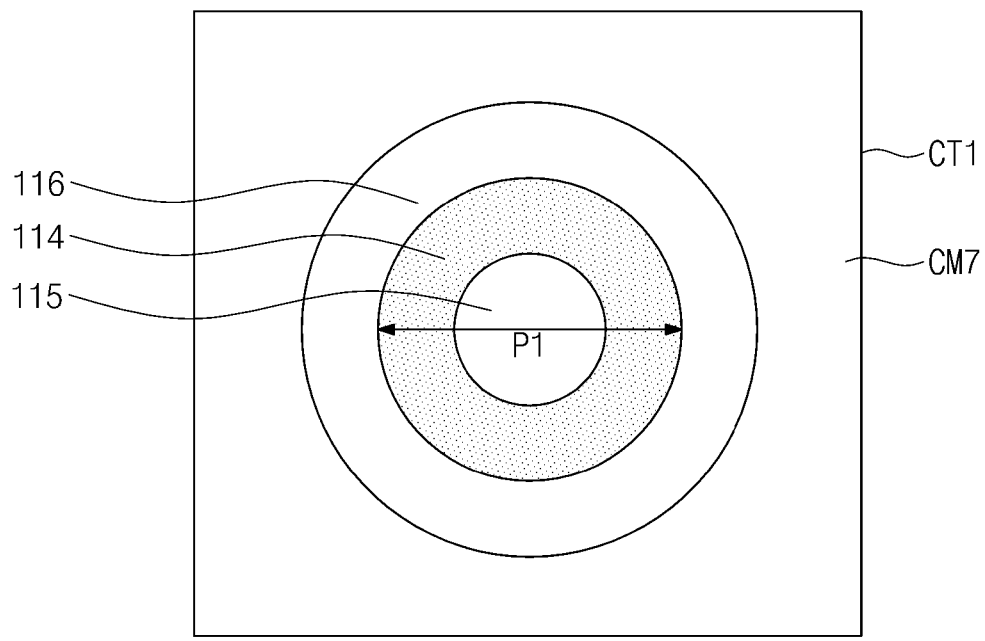
FIG. 7 is a cross sectional view of the first and second cell transistors taken in the first direction and the third direction.
Figure 7:
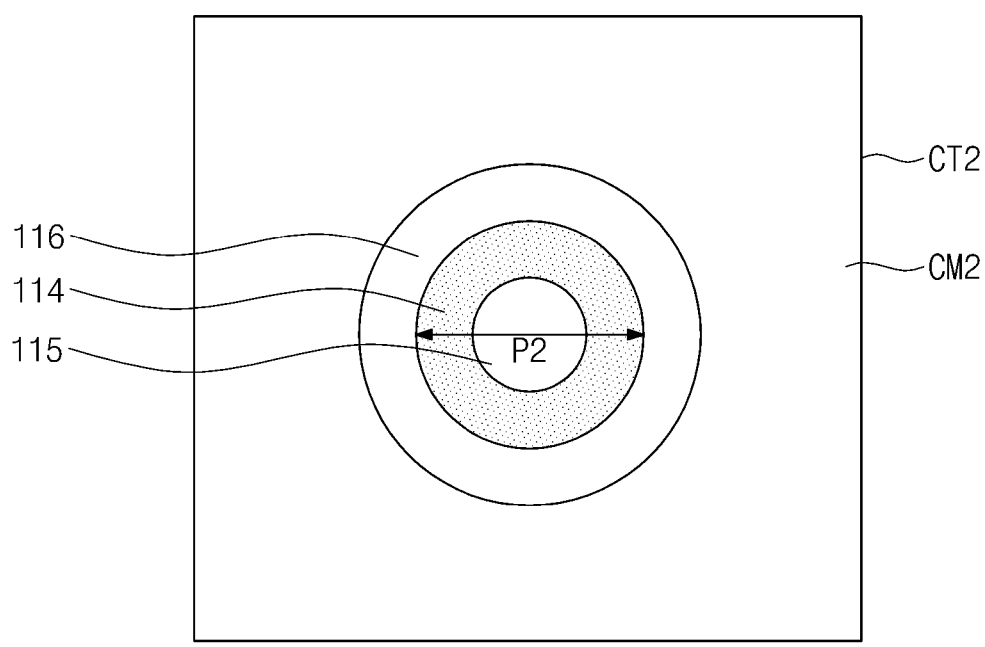

FIG. 7 is a cross sectional view of the first and second cell transistors taken in the first direction and the third direction. Referring to FIG. 7, a width P1 of a pillar corresponding to the first cell transistor CT1 may be wider than that P2 of a pillar corresponding to the second cell transistor CT2. Accordingly, an area of an information storage film 116 corresponding to the first cell transistor CT1 may be larger than that corresponding to the second cell transistor CT2.

The information storage film 116 may be an insulation film. It is assumed that the first and second cell transistors CT1 and CT2 are memory cells connected with unselected word lines, respectively. Pass voltage signals may be applied to the second and seventh conductive materials CM2 and CM7, respectively.

A voltage difference may arise between a channel film 114 and the seventh conductive material CM7 of the first cell transistor CT1. An information storage film 116 may be provided between the channel film 114 and the seventh conductive material CM7. Accordingly, the first cell transistor CT1 may act as a capacitor. When a driving signal is applied to the seventh conductive material CM7, a voltage level of the driving signal may increase by lapse of time and may then reach a pass voltage level.

Likewise, a channel film 114 and the second conductive material CM2 of the second cell transistor CT2 may constitute a capacitor together with an information storage film 116 being an insulation film. An area of the information storage film 116 corresponding to the second cell transistor CT2 may be less than that corresponding to the first cell transistor CT1.

This means that a capacitance value of a capacitor formed of the channel film 114, the second conductive material CM2, and the information storage film 116 is less than that of a capacitor formed of the channel film 114, the seventh conductive material CM7, and the information storage film 116. If the amount of current flowing in via the second conductive material CM2 per hour is identical to that flowing in via the seventh conductive material CM7, a time taken for a driving signal applied to the second conductive material CM2 to reach a pass voltage level may be shorter than a time taken for a driving signal applied to the seventh conductive material CM7 to reach a pass voltage level.

Figure 8:
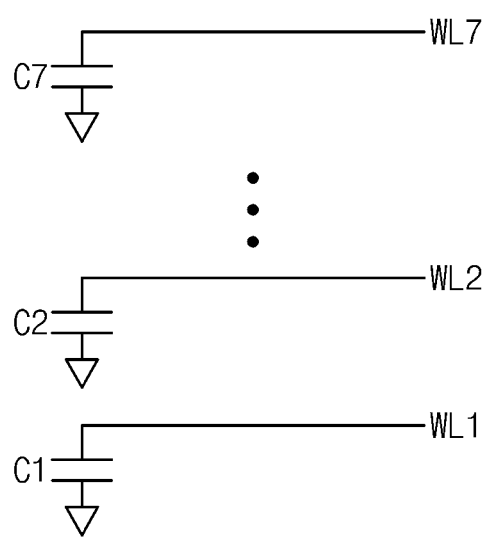
FIG. 8 is a diagram illustrating equivalent capacitors connected with respective word lines.

FIG. 8 is a diagram illustrating equivalent capacitors connected with respective word lines. Referring to FIG. 8, the first capacitor C1 may correspond to total capacitance of memory cells connected with the first word line WL1. The second capacitor C2 may correspond to total capacitance of memory cells connected with the second word line WL2. Likewise, the seventh capacitor C7 may correspond to total capacitance of memory cells connected with the seventh word line WL7.

Each capacitance may be determined according to a width of a pillar corresponding to each word line. That is, a capacitance value of a capacitor connected with a word line adjacent to a substrate 111 may be relatively small, and a capacitance value of a capacitor connected with a word line far away from the substrate 111 may be relatively large. That is, capacitance values of the first to seventh capacitors C1 to C7 may increase sequentially.

A driving signal applied to a word line may increase by lapse of time due to a capacitor connected with the word line. Below, a time from a point of time when a driving signal is applied to a point of time when it reaches a pass voltage level may be referred to as a word line loading time. A rising slope may indicate such a rate that a voltage level of a driving signal increases by lapse of time. For example, the rising slope may be determined according to a ratio of a word line loading time to a pass voltage level.

If the quantities of charge flowing into each word line per hour are different from one another, word line loading times of word lines may be determined depending upon capacitance values of capacitors connected with the word lines. In particular, a word line loading time of a word line adjacent to a substrate 111 may be shorter than that of a word line far away from the substrate 111.

The quantities of charge flowing into word lines may be controlled such that word line loading times of word lines are identical to one another. This will be more fully described with reference to FIG. 11.

Figure 9:
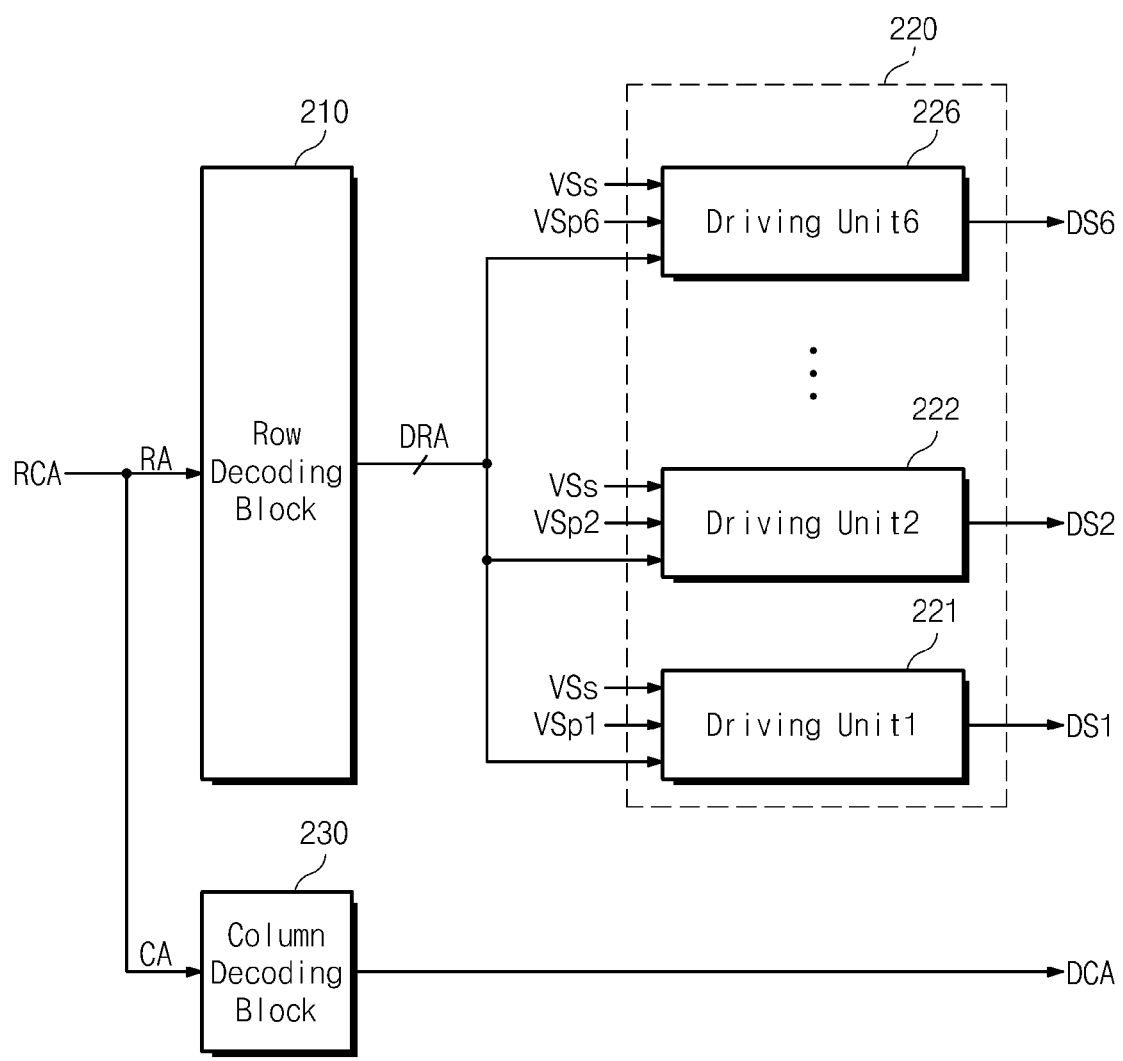
FIG. 9 is a block diagram illustrating a row selecting circuit in FIG. 1.

FIG. 9 is a block diagram illustrating a row selecting circuit in FIG. 1. Below, FIGS. 9 to 12 will be described under the assumption that a voltage generating circuit 130 includes six pass voltage generators and a row selecting circuit 120 receives six pass voltage signals VSp1 to VSp6. Further, it is assumed that word lines WL are formed of the first to sixth word lines WL1 to WL6 as described in FIGS. 3 to 6.

Referring to FIG. 9, the row selecting circuit 120 may include a row decoding block 210, a driving block 220, and a column decoding block 230.

The row decoding block 210 may be configured to decode an input row address RA. The row decoding block 210 may send the decoded row address DRA to the driving block 220.

The driving block 220 may receive the decoded row address DRA. The driving block 220 may receive the first to sixth pass voltage signals VSp1 to VSp6 and a selection voltage signal VSs from the voltage generating circuit 130.

The driving block 220 may include the first to sixth driving units 221 to 226. Each of the first to sixth driving units 221 to 226 may receive the selection voltage signal VSs. Further, the first to sixth driving units 221 to 226 may receive the first to sixth pass voltage signals VSp1 to VSp6, respectively.

Each of the first to sixth driving units 221 to 226 may select one of the selection voltage signal VSs and a corresponding pass voltage signal according to the decoded row address DRA and may output the selected signal as a driving signal. The first to sixth driving units 221 to 226 may output the first to sixth driving signals DS1 to DS6, respectively. The first to sixth driving signals DS1 to DS6 may be sent to the first to sixth word lines WL1 to WL6 (refer to FIG. 6), respectively.

As a result, the driving block 220 may transfer the selection voltage signal VSs to a selected word line as a driving signal according to the decoded row address DRA. The driving block 220 may provide unselected word lines with corresponding pass voltage signals based upon the decoded row address DRA.

The column decoding block 230 may be configured to decode an input column address CA. The column decoding block 230 may send the decoded column address DCA to a read/write circuit 160.

Figure 10:
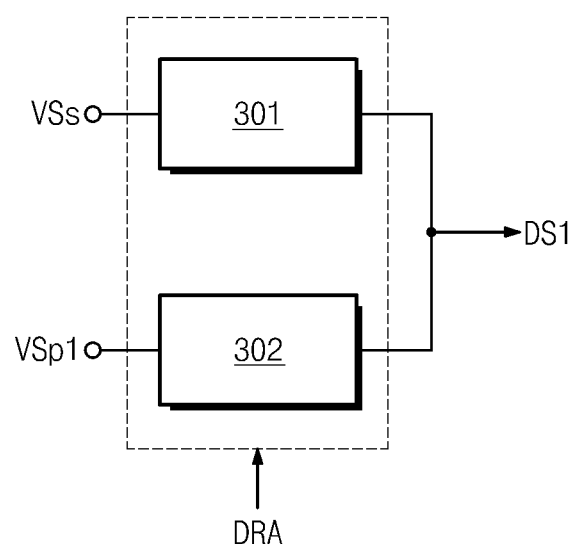
FIG. 10 is a block diagram of the first driving unit in FIG. 9.

FIG. 10 is a block diagram of the first driving unit in FIG. 9. The second to sixth driving units 222 to 226 in FIG. 9 may be configured the same as the first driving unit in FIG. 10.

Referring to FIG. 10, the first driving unit 221 may include the first and second switches 301 to 302. The first driving unit 221 may output one of a selection voltage signal VSs and the first pass voltage signal VSp1 as the first driving signal DS1 in response to a decoded row address DRA.

The first switch 301 may be activated according to the decoded row address DRA to output the selection voltage signal VSs. The second switch 302 may be activated according to the decoded row address DRA to output the first pass voltage signal VSp1. When the first switch 301 is activated, the second switch 302 may be inactivated. When the first switch 301 is inactivated, the second switch 302 may be activated.

For example, if the first word line WL1 is a selected word line, the first switch 301 may transfer the selection voltage signal VSs to the first word line WL1 according to the decoded row address DRA. If the first word line WL1 is an unselected word line, the second switch 302 may transfer the first pass voltage signal VSp1 to the first word line WL1 according to the decoded row address DRA.

Figure 11:
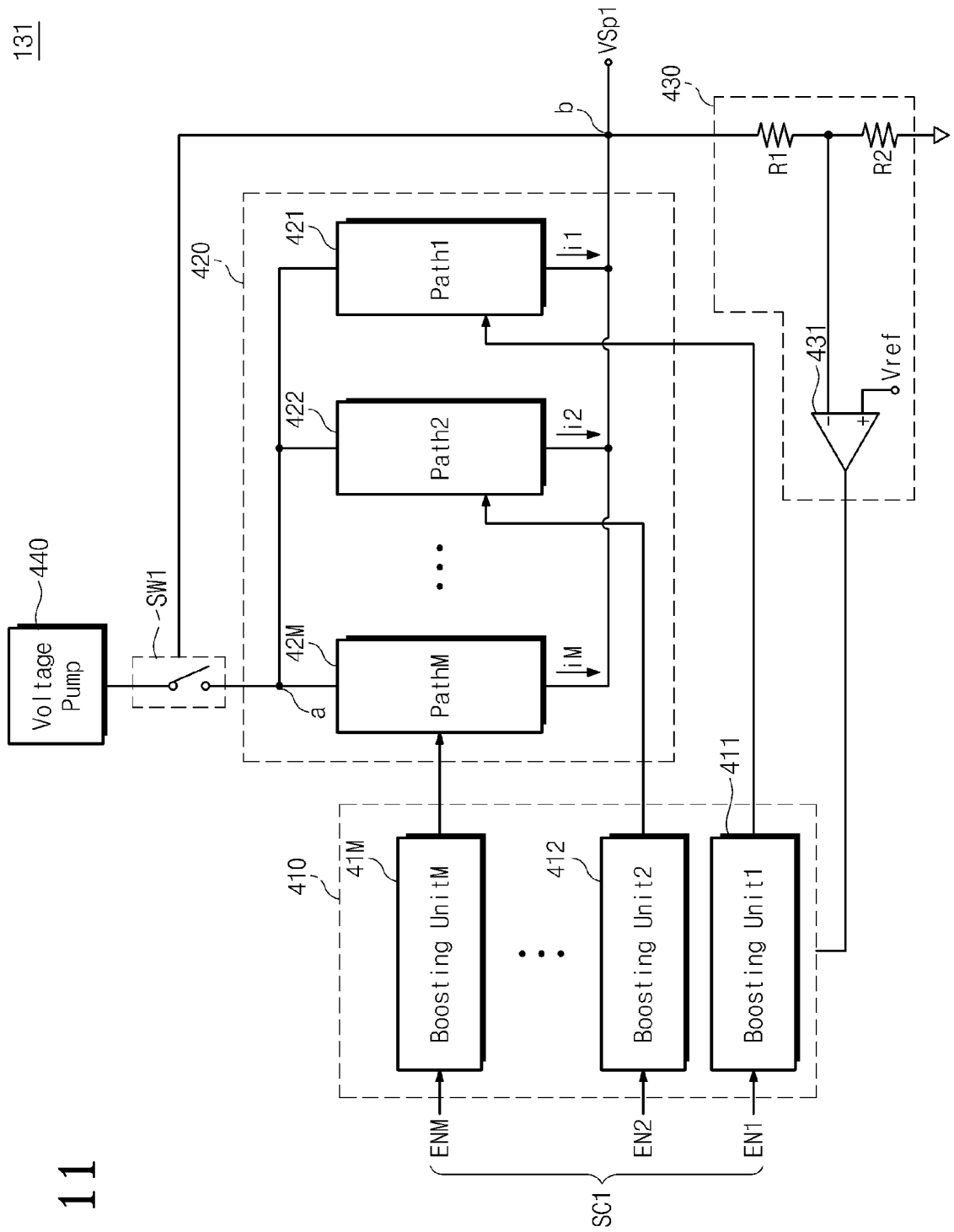
FIG. 11 is a block diagram illustrating one of the pass voltage generators in FIG. 1.

FIG. 11 is a block diagram illustrating one of the pass voltage generators in FIG. 1. In FIG. 11, one pass voltage generator 131 is illustrated. The remaining pass voltage generators 132 to 13N may be configured the same as that in FIG. 11.

Referring to FIG. 11, the pass voltage generator 131 may include a boosting block 410, a current path block 420, a slope control signal breaking block 430, and a voltage pump 440. The boosting block 410 may receive a slope control signal SC1. The slope control signal SC1 may include a plurality of enable signals EN1 to ENM.

The boosting block 410 may be activated or inactivated in response to the control of the slope control signal breaking block 430. When activated, the boosting block 410 may activate current paths 421 to 42M of the current path block 420 according to the slope control signal SC1. When inactivated, the boosting block 410 may interrupt the slope control signal SC1.

The boosting block 410 may include a plurality of boosting units 411 to 41M receiving the enable signals EN1 to ENM, respectively.

The enable signals EN1 to ENM may be signals for activating or inactivating the current paths 421 to 42M, respectively. Each of the enable signals EN1 to ENM may have a relatively low voltage level. The current paths 421 to 42M may receive a source voltage of a relatively high level from the voltage pump 440. That is, the current paths 421 to 42M may operate at a relatively high voltage level. It is assumed that the current paths 421 to 42M directly receive the enable signals EN1 to ENM, respectively, and operate in response thereto. The current paths 421 to 42M cannot be controlled effectively according to the enable signals EN1 to ENM.

According to example embodiments of inventive concepts, the pass voltage generator 131 may include boosting units 411 to 41M for controlling the current paths 421 to 42M which operate at a relatively high voltage. Each of the boosting units 411 to 41M may activate a corresponding one of the current paths 421 to 42M in response to an input enable signal.

The current path block 420 may include the current paths 421 to 42M. The current paths 421 to 42M may be connected in parallel between nodes a and b. The current path block 420 may receive a source voltage from the voltage pump 440 via the first switch SW1 and the node a. A current may flow from the node a to the node b via activated ones of the current paths 421 to 42M.

The node b may be an output node of the current paths 421 to 42M. The node b may be connected with the first driving unit 221. The first pass voltage signal VSp1 may be provided via the node b.

The current paths 421 to 42M may be activated according to output signals of the boosting units 411 to 41M, respectively. The quantity of charge transferred to the node b may be controlled according to the number of activated current paths. For example, as the number of activated current paths decreases, the quantity of charge transferred to the node b may decrease.

The node b may be connected with the first word line WL1 via the first driving unit 221, and the first word line WL1 may be connected with the first capacitor C1 (refer to FIGS. 8-9). In the event that the first pass voltage signal VSp1 is provided as the first driving signal DS1 (or, when the first word line WL1 is unselected), as the quantity of charge transferred to the node b decreases, a word line loading time of the first word line WL1 may increase.

According to example embodiments of inventive concepts, the number of current paths in each pass voltage generator being activated may be controlled such that word line loading times of unselected word lines are identical to one another. That is, the number of current paths in each pass voltage generator being activated may be controlled such that rising slopes of driving signals applied to unselected word lines respectively are identical to one another.

At this time, that rising slopes of driving signals applied to unselected word lines respectively are maintained identically may mean that the number of current paths used in the respective pass voltage generators 131 to 13N are different from one another.

The first switch SW1 may connect the voltage pump 440 and the current path block 420 according to a voltage level of the node b. That is, the first switch SW1 may interrupt connection between the voltage pump 440 and the current path block 420 when a voltage level of the first pass voltage signal VSp1 is higher than a predetermined level. According to example embodiments, the first switch SW1 may be formed of a transistor, for example a PMOS transistor, but example embodiments are not limited thereto.

The slope control signal breaking block 430 may activate or inactivate the boosting block 410 according to a voltage level of the node b. The slope control signal breaking block 430 may inactivate the boosting block 410 when a voltage level of the node b is higher than a desired (or alternatively predetermined) voltage level.

The slope control signal breaking block 430 may include the first and second resistors R1 and R2 and a comparator 431. A voltage level of the node b may be determined according to impedance values of the first and second resistors R1 and R2. A voltage level of the node b may be adjusted by controlling the values of the first and second resistors R1 and R2. According to example embodiments, when each of program and read operations is executed, at least one of the first and second resistors R1 and R2 may be a variable resistor for providing a pass voltage signal VSp1 having different voltage levels. According to example embodiments, a resistance value of at least one of the first and second resistors R1 and R2 may be varied according to the control of control logic 180 in FIG. 1.

The comparator 431 may compare a voltage of a node between the first and second resistors R1 and R2 with a reference voltage Vref to output a comparison result. An output of the comparator 431 may be sent to the boosting block 410.

The voltage pump 440 may boost a power supply voltage supplied to a nonvolatile memory 100 to provide the boosted voltage to the node a as a source voltage. According to example embodiments, the voltage pump 440 may be included within the pass voltage generator 131. However, the voltage pump 440 may be shared by the pass voltage generators 131 to 13N. That is, the current path block 420 in each pass voltage generator may receive a source voltage from the voltage pump 440.

Figure 12:
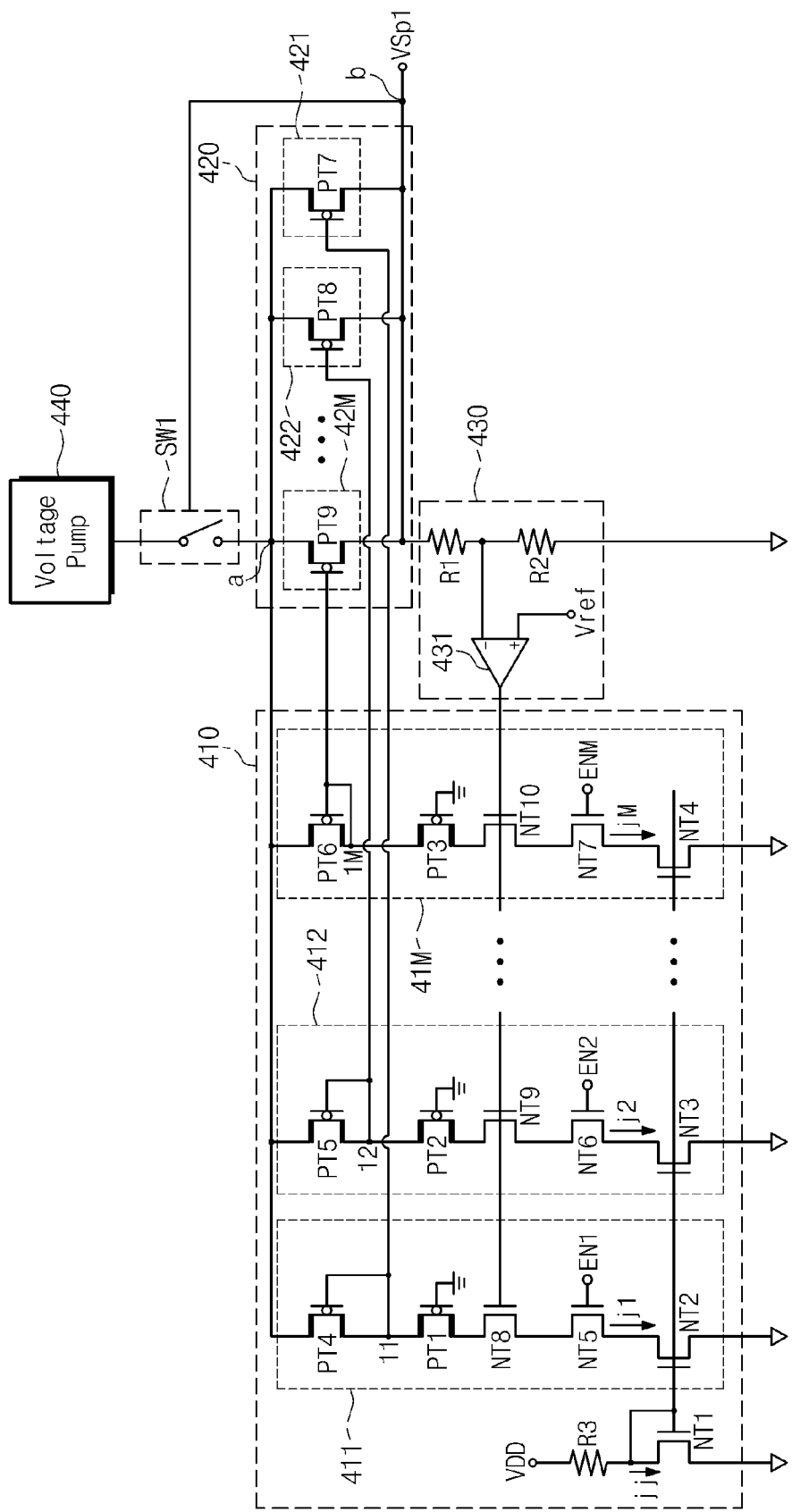
FIG. 12 is a circuit diagram illustrating a pass voltage generator in FIG. 11.

FIG. 12 is a circuit diagram illustrating a pass voltage generator in FIG. 11. Referring to FIG. 12, a supply voltage (e.g., VDD) may be provided to the third resistor R3. The third resistor R3 and the first NMOS transistor NT1 connected with the third resistor R3 may constitute a current minor with any one of the second to fourth NMOS transistors NT2 to NT4. Accordingly, currents j1 to jM flowing into boosting units 411 to 41M may be determined according to a current jj.

PMOS transistors PT4 to PT6 in the boosting units 411 to 41M may constitute current mirrors with current paths 421 to 42M, respectively. For example, the PMOS transistor PT4 in the boosting unit 441 may constitute a current mirror with the seventh PMOS transistor PT7 in the current path 421. The PMOS transistor PT5 in the boosting unit 412 may constitute a current minor with the eighth PMOS transistor PT8 in the current path 422. The PMOS transistor PT6 in the boosting unit 41M may constitute a current minor with the ninth PMOS transistor PT9 in the current path 42M. Accordingly, when the currents j1 to jM flow, currents flow through the current paths 421 to 42M.

The currents j1 to jM may be interrupted according to enable signals EN1 to ENM. For example, the fifth NMOS transistor NT5 may be turned on or off according to the enable signal EN1. The sixth NMOS transistor NT6 may be turned on or off according to the enable signal EN2. The seventh NMOS transistor NT7 may be turned on or off according to the enable signal ENM.

Accordingly, when each enable signal is activated, a current may flow through each current path. For example, when the enable signal EN1 is activated, the current j1 may flow, so that a current flows through the current path 421. When the enable signal EN2 is activated, the current j2 may flow, so that a current flows through the current path 422. Likewise, when the enable signal ENM is activated, the current jM may flow, so that a current flows through the current path 42M.

When each enable signal is inactivated, a current flowing via each current path may be interrupted. For example, when the enable signal EN1 is inactivated, the current j1 may be interrupted, so that the first node 11 is floated. A voltage of the first node 11 may increase according to a voltage of an adjacent node (e.g., a node a), and the seventh PMOS transistor 421 may be turned off. Likewise, nodes 12 and 1M may be floated according to the enable signals EN2 and ENM, and the eighth and ninth transistors PT8 and PT9 may be turned off.

As a result, the current paths 421 to 42M may be activated according to the enable signals EN1 to ENM, respectively. For example, when the enable signal EN1 is inactivated, the current j1 may be interrupted, so that a current flowing via the current path 421 is interrupted. When the enable signal EN2 is inactivated, the current j2 may be interrupted, so that a current flowing via the current path 422 is interrupted. Likewise, when the enable signal ENM is inactivated, the current jM may be interrupted, so that a current flowing via the current path 42M is interrupted.

The currents j1 to jM may be interrupted according to an output signal of the comparator 431. For example, the NMOS transistors NT8 to NT10 may be turned on or off according to an output signal of the comparator 431. If the currents j1 to jM are interrupted according to an output signal of the comparator 431, the current paths 421 to 42M may not operate regardless of the enable signals EN1 to ENM.

Figure 13:
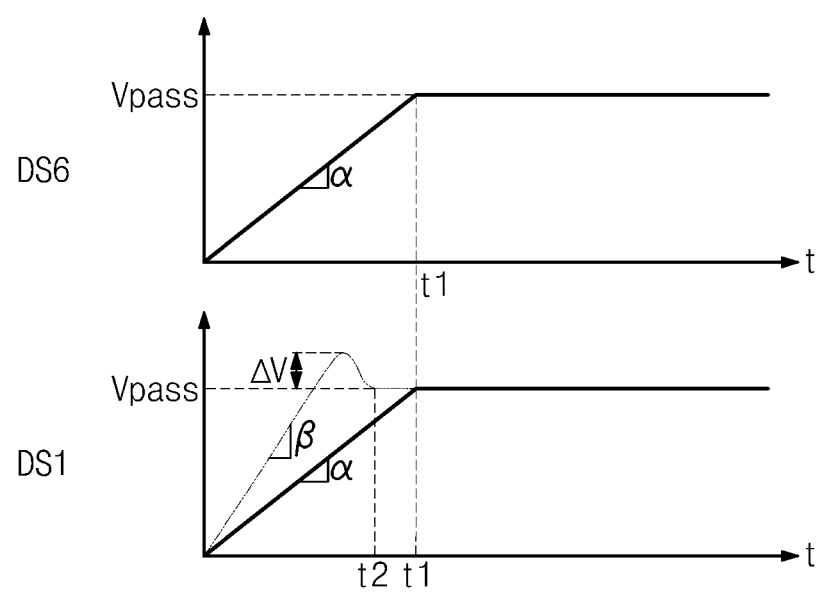
FIG. 13 is a diagram illustrating voltage variations of the first and sixth driving signals.

FIG. 13 is a diagram illustrating voltage variations of the first and sixth driving signals. It is assumed that the first and sixth word lines WL1 and WL6 supplied with the first and sixth driving signals DS1 and DS6 are unselected word lines. With this assumption, the first and sixth pass voltage signals VSp1 and VSp6 may be supplied as the first and sixth driving signals DS1 and DS6, respectively.

Referring to FIG. 13, the sixth driving signal DS6 may increase along a rising slope of 'α' until the first time t1 from an applying time of the sixth driving signal DS6. The first time t1 may be a word line loading time of the sixth word line WL6. At t1, a voltage level of the sixth driving signal DS6 may reach a pass voltage level Vpass. Afterwards, the sixth driving signal DS6 may be maintained at a stabilization state.

The first word line WL1 may be closer to a substrate as compared with the sixth word line WL6. A capacitance value of a capacitor C1 (refer to FIG. 8) connected with the first word line WL1 may be less than a capacitance value of a capacitor C6 (refer to FIG. 8) connected with the sixth word line WL6. It is assumed that the number of current paths being used to generate the sixth driving signal DS6 is identical to that being used to generate the first driving signal DS1. With this assumption, a rising slope of the first driving signal DS1 may be sharper than that of the sixth driving signal DS6. In FIG. 13, the rising slope of the first driving signal DS1 may be represented by 'β', and the rising slope of the first driving signal DS1 may be represented by 'α'. Herein, 'β' may be larger than 'α'.

After a voltage level of the first driving signals DS1 reaches the pass voltage level Vpass, it may further increase by a specific voltage level ΔV1 due to the sharp rising slope 'β'. That is, overshooting of the first driving signal DS1 may arise. This may make a threshold voltage of a memory cell increase unintentionally due to the overshooting of the first driving signal DS1. Further, the overshooting of the first driving signal DS1 may cause the electric field coupling (or, called the F-poly coupling) between adjacent memory cells.

The voltage level of the first driving signal DS1 may be settled upon a stabilization state after the second time t2 prior to the first time t1. This may mean that the first and sixth driving signals DS1 and DS6 reach the stabilization state at different timing. Accordingly, the reliability of a nonvolatile memory at programming may be lowered.

According to example embodiments of inventive concepts, the number of current paths being used to generate the first and sixth driving signals DS1 and DS6 may be controlled such that a rising slope of the first driving signal DS1 is identical to that of the sixth driving signal DS6. The number of current paths being used to generate the first driving signal DS1 may be less than being used to generate the sixth driving signal DS6. Under this condition, the sixth driving signal DS6 may have the same rising slope 'α' as the first driving signal DS1. If the first driving signal DS1 has the rising slope of 'α', its voltage level may reach the pass voltage level Vpass at the first time t1.

Figure 14:
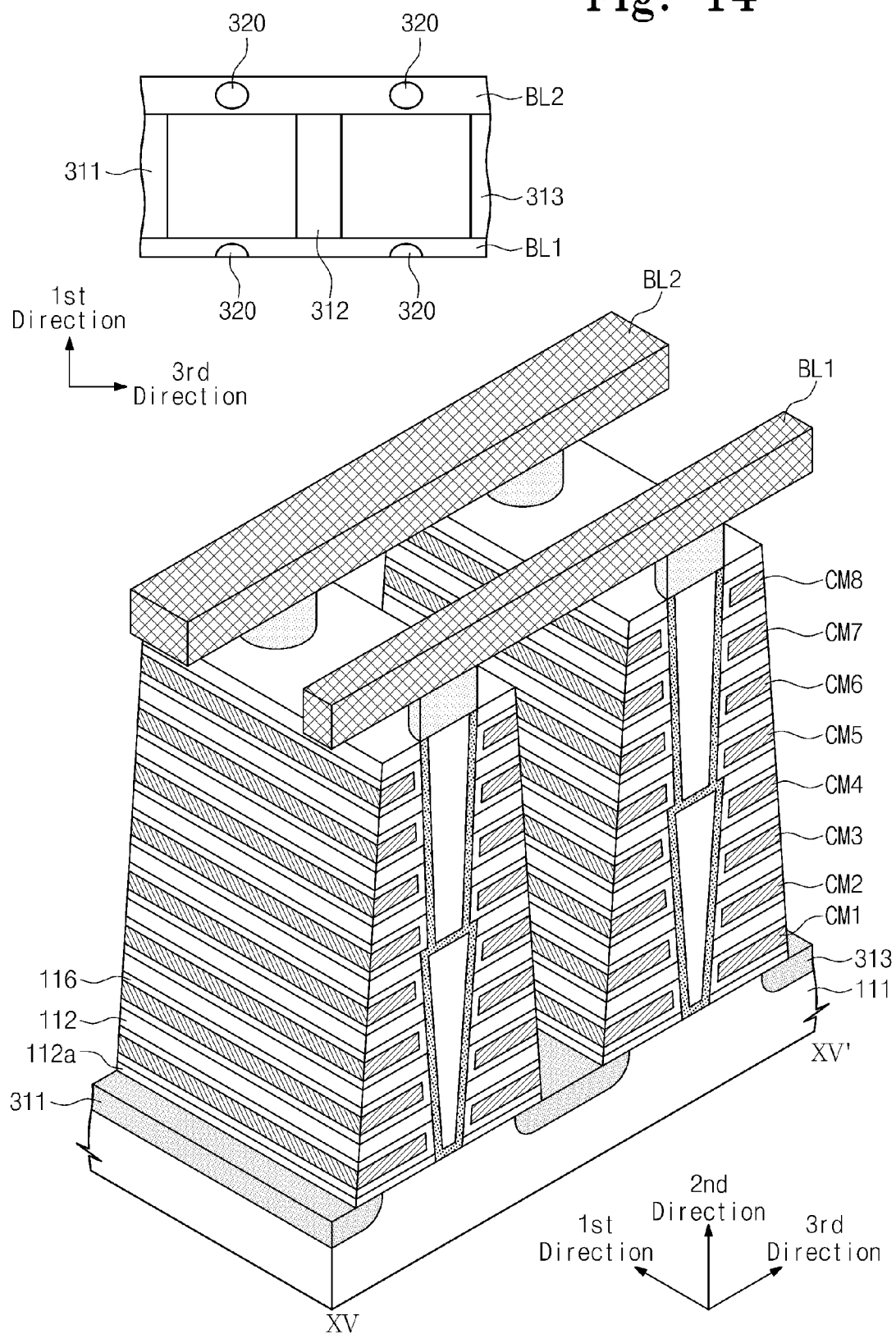
FIG. 14 is a perspective view illustrating a memory block in FIG. 2 according to example embodiments of inventive concepts.
Figure 15:
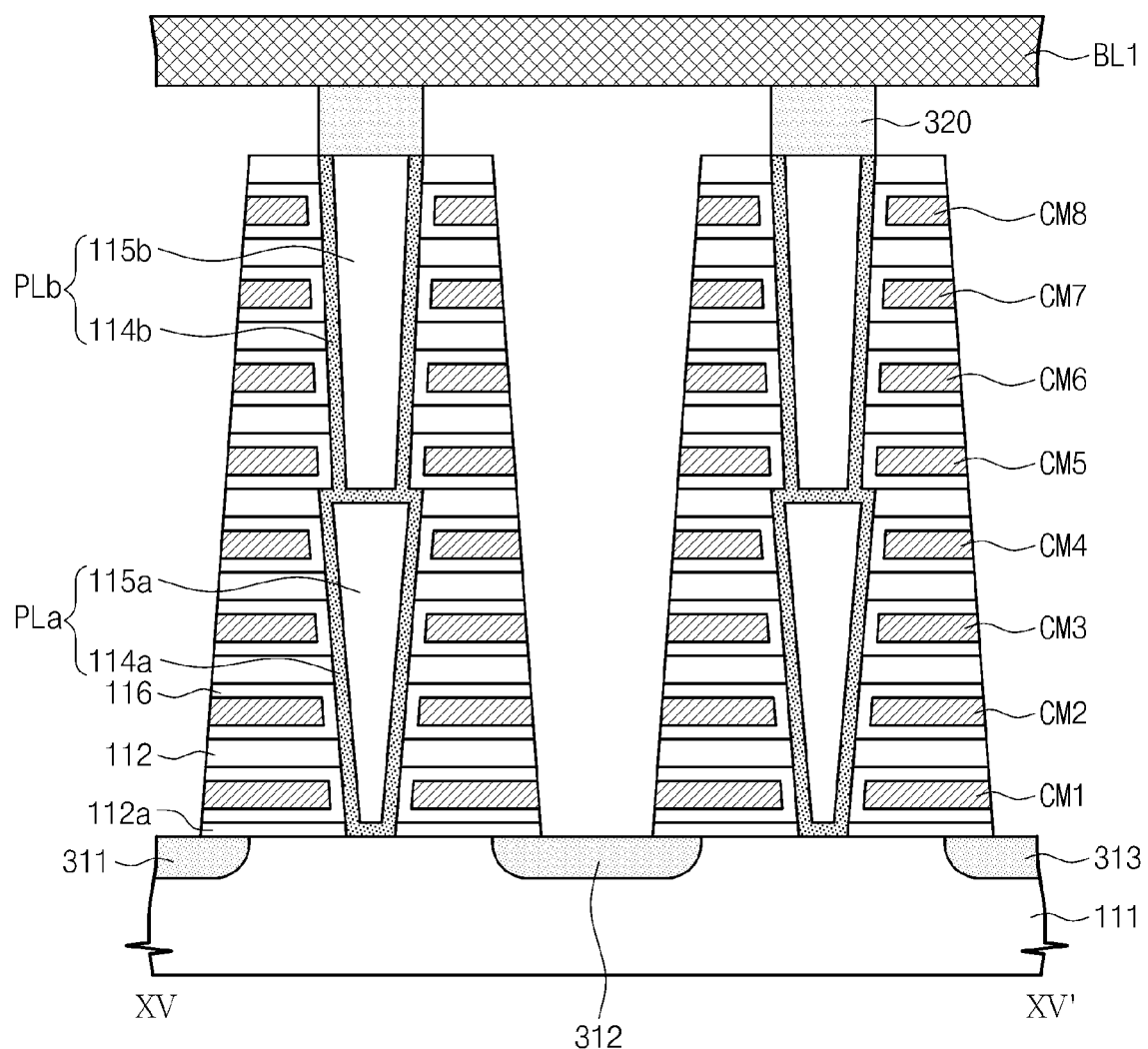
FIG. 15 is a cross-sectional view of a memory block in FIG. 14 taken along a line XV-XV'.
Figure 15:
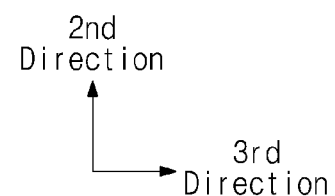

FIG. 14 is a perspective view illustrating a memory block in FIG. 2 according to example embodiments of inventive concepts. FIG. 15 is a cross-sectional view of a memory block in FIG. 14 taken along a line XV-XV'. As compared with a memory block BLK1 described with reference to FIGS. 3 to 5, each pillar PL of a memory block in FIG. 14 may include a first sub pillar PLa and a second sub pillar PLb. Duplicate description of the same elements is thus omitted.

Referring to FIGS. 14 and 15, the first sub pillar PLa may be provided on a substrate 111. For example, a channel film 114a of the first sub pillar PLa may include a p-type silicon material. The channel film 114a of the first sub pillar PLa may act as a body of the second direction. An inner material 115a of the first sub pillar PLa may be formed of an insulation material.

A second sub pillar PLb may be provided on the first sub pillar PLa. For example, a channel film 114b of the second sub pillar PLb may include a p-type silicon material. The channel film 114b of the second sub pillar PLb may act as a body of the second direction. An inner material 115b of the second sub pillar PLb may be formed of an insulation material. The closer to the substrate 111, the narrower widths of the first and second sub pillars PLa and PLb.

The channel film 114a of the first sub pillar PLa may be connected with the channel film 114b of the second sub pillar PLb. For example, the channel film 114a of the first sub pillar PLa may be connected with the channel film 114b of the second sub pillar PLb via a p-type silicon pad (not shown).

The first sub pillar PLa may provide a channel to cell transistors of the first to fourth heights. The second sub pillar PLb may provide a channel to cell transistors of the fifth to eighth heights. An equivalent circuit of the memory block BLK1 described with reference to FIGS. 14 and 15 may be configured the same as that in FIG. 6. Cell transistors of the second to fourth heights may act as a memory cell, and cell transistors of the fifth to seventh heights may act as a memory cell. Memory cells of each height may be connected with one word line.

As illustrated in FIGS. 14 and 15, a width of each sub pillar may become narrower as each sub pillar becomes closer to the substrate 111. In unselected word lines corresponding to a sub pillar, the number of current paths being used to generate a driving signal applied to an unselected word line far away from the substrate 111 may be more than that being used to generate a driving signal applied to an unselected word line adjacent to the substrate 111. That is, a driving signal applied to a word line adjacent to the substrate 111 may be generated using less current paths as compared with a driving signal applied to an unselected word line far away from the substrate 111.

Figure 16:
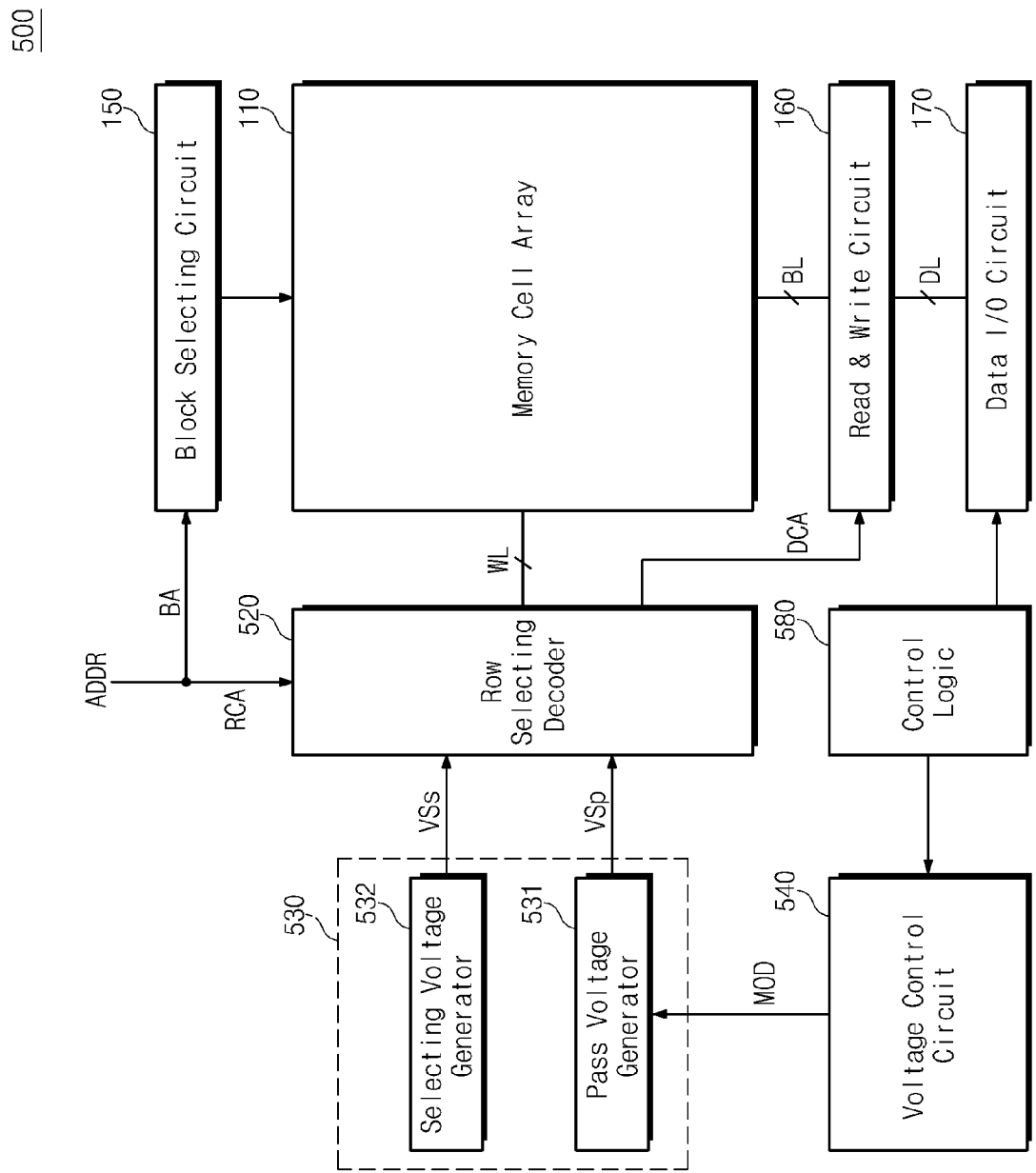
FIG. 16 is a block diagram illustrating a nonvolatile memory according to example embodiments of inventive concepts.
Figure 17:
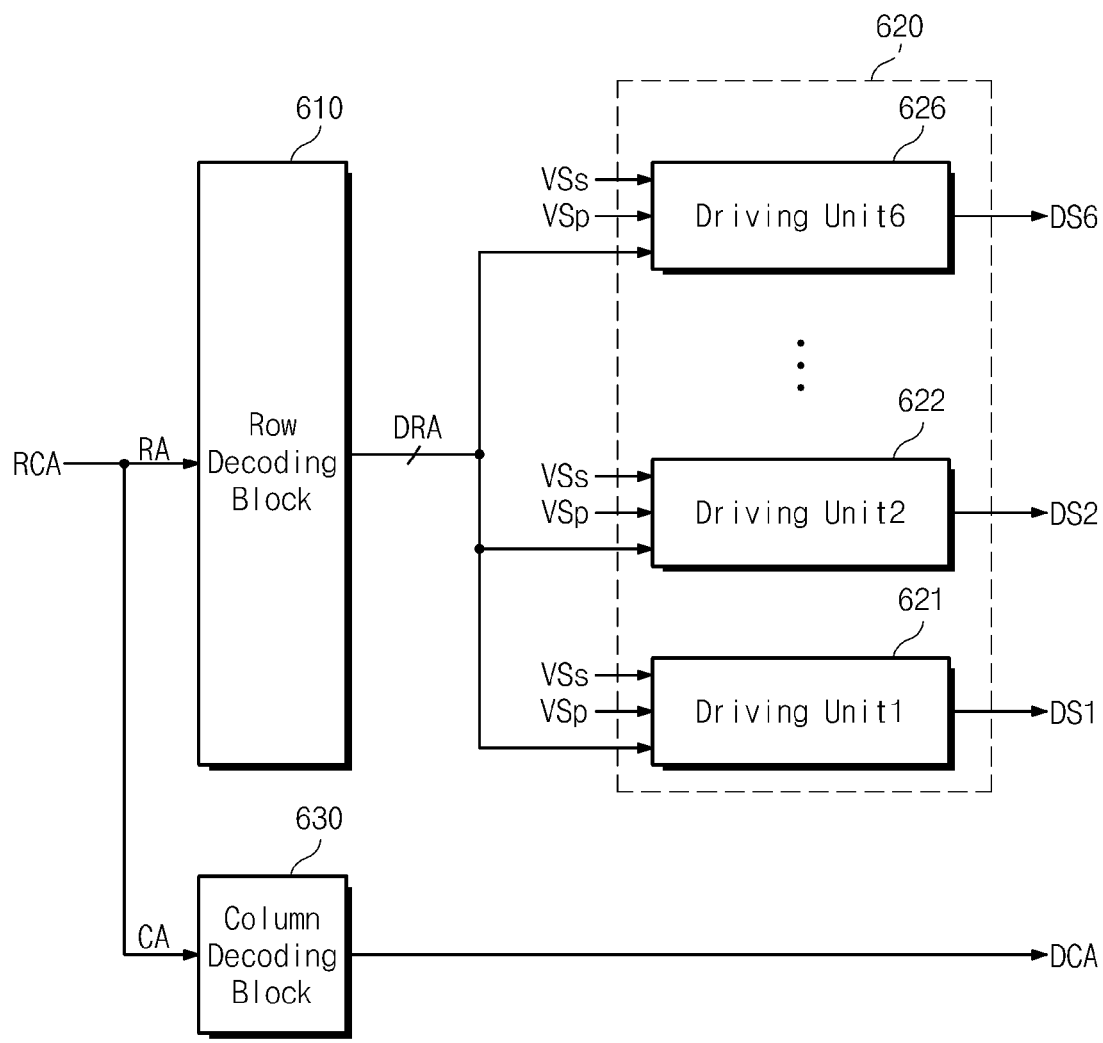
FIG. 17 is a block diagram illustrating a row selecting circuit in FIG. 16.

FIG. 16 is a block diagram illustrating a nonvolatile memory according to example embodiments of inventive concepts. FIG. 17 is a block diagram illustrating a row selecting circuit in FIG. 16.

Referring to FIG. 16, a nonvolatile memory 500 may be configured the same as that in FIG. 1 except for a row selecting circuit 520, a voltage generating circuit 530, a voltage control circuit 540, and control logic 580, and description thereof is thus omitted.

The row selecting circuit 520 may receive a selection voltage signal VSs and a pass voltage signal VSp from the voltage generating circuit 530. The row selecting circuit 520 may provide the selection voltage signal VSs with a word line selected according to a row address RA in a row and column address RCA. Unselected word lines may be supplied with the pass voltage signal VSp via the row selecting circuit 520. The row selecting circuit 520 may decode a column address CA in the row and column address RCA.

Referring to FIG. 17, a row decoding block 610 in the row selecting circuit 520 may decode a row address RA to generate a decoded row address DRA. Each of driving units 621 to 626 in a driving block 620 may receive the selection voltage signal VSs and the pass voltage signal VSp. Each of the driving units 621 to 626 may output one of the selection voltage signal VSs and the pass voltage signal VSp as a driving signal depending upon the decoded row address DRA. The first to sixth driving signals DS1 to DS6 may be sent to the first to sixth word lines WL1 to WL6 in FIG. 6, respectively.

A column decoding block 630 may decode a column address CA in the row and column address RCA to send it to a read/write circuit 160.

Returning to FIG. 16, the voltage generating circuit 530 may include a pass voltage generator 531 and a selection voltage generator 532. The selection voltage generator 532 may be configured to generate the selection voltage signal VSs to be supplied to a selected word line.

The pass voltage generator 531 may be configured to generate the pass voltage signal VSp according to a mode signal MOD from the voltage control circuit 540. A rising slope of the pass voltage signal VSp may be determined according to the mode signal MOD.

The selection voltage signal VSs may have different voltage levels according to an operation mode. For example, a voltage level of the selection voltage signal VSs generated at programming may be different from that generated at reading. A voltage level of the pass voltage signal VSp may be changed according to the control of the control logic 580.

The pass voltage signal VSp may have different voltage levels according to an operation mode. For example, a voltage level of the pass voltage signal VSp generated at programming may be different from that generated at reading. A voltage level of the pass voltage signal VSp may be changed according to the control of the control logic 580.

The voltage control circuit 540 may operate in response to the control of the control logic 580. The voltage control circuit 540 may receive mode information from the control logic 580. The mode information may indicate information associated with whether an operation executed by the nonvolatile memory 500 is a read operation or a program operation. The voltage control circuit 540 may transfer the mode signal MOD to the voltage generating circuit 530 in response to the mode information from the control logic 580.

Figure 18:
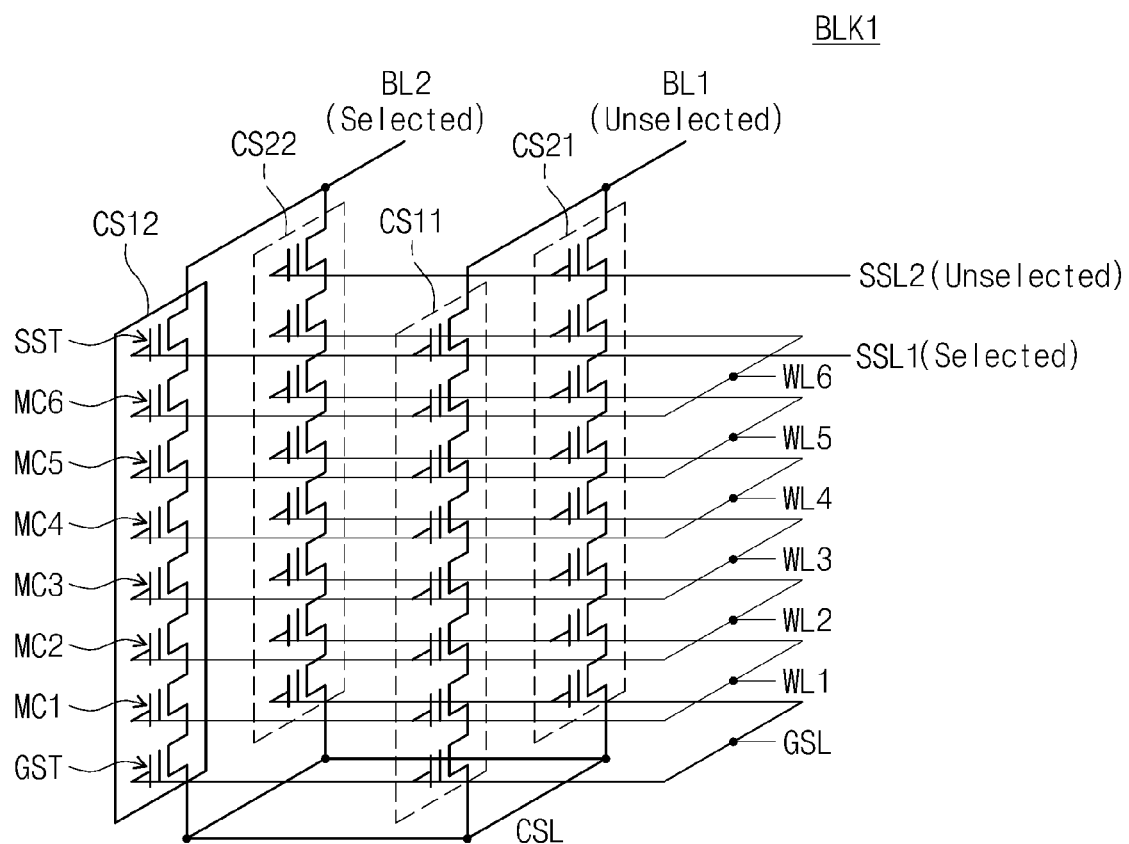
FIG. 18 is a diagram for describing a non-floated cell string in a selected memory block at a program operation.

FIG. 18 is a diagram for describing a non-floated cell string in a selected memory block at a program operation.

Referring to FIG. 18, the first string selection line SSL1 may be selected while the second string selection line SSL2 may be unselected. For example, the first string selection line SSL1 may be selected by applying a power supply voltage to the first string selection line SSL1, and the second string selection line SSL2 may be unselected by applying a ground voltage to the second string selection line SSL2. With this condition, cell strings CS21 and CS22 may be isolated from the first and second bit lines BL1 and BL2, respectively.

The second bit line BL2 may be selected while the first bit line BL1 may be unselected. For example, the second bit line BL2 may be selected by applying a ground voltage to the second bit line BL2, and the first bit line BL1 may be unselected by applying a power supply voltage to the first bit line BL1. With a bias condition of a string selection transistor in the cell string CS11, the cell string CS11 may not be connected with the first bit line BL1.

At programming, a ground voltage may be applied to a ground selection line GSL of the selected memory block BLK1. This may make ground selection transistors GST be turned off. Accordingly, cell strings CS11, CS12, CS21, and CS22 may not be connected with a common source line CSL.

With the above description, the cell string CS12 may be connected with the second bit line BL2 so as to be supplied with a ground voltage from the second bit line BL2. The remaining cell strings CS11, CS21, and CS22 may be floated. A cell string marked by a solid line may indicate a cell string CS12 being not floated.

When driving signals DS1 to DS6 (refer to FIG. 17) are applied to word lines WL1 to WL6, respectively, memory cells in the cell string CS12 may provide a specific capacitance value. For example, a ground voltage may be applied to a pillar PL12 (refer to FIGS. 3 and 4) corresponding to the cell string CS12 via the bit line BL2. Channels of memory cells of the cell string CS12 may be formed by applying driving signals to word lines, respectively. Each memory cell may act as a capacitor when a ground voltage is applied to a body of each memory cell via the bit line BL2 and driving signals are applied to gates of memory ells via word lines.

On the other hand, bodies of memory cells in floated cell strings CS11, CS21, and CS22 may be floated. When driving signals are applied to word lines, the memory cells in the floated cell strings CS11, CS21, and CS22 may provide a relatively less capacitance value as compared with memory cells in the non-floated cell string CS12.

Figure 19:
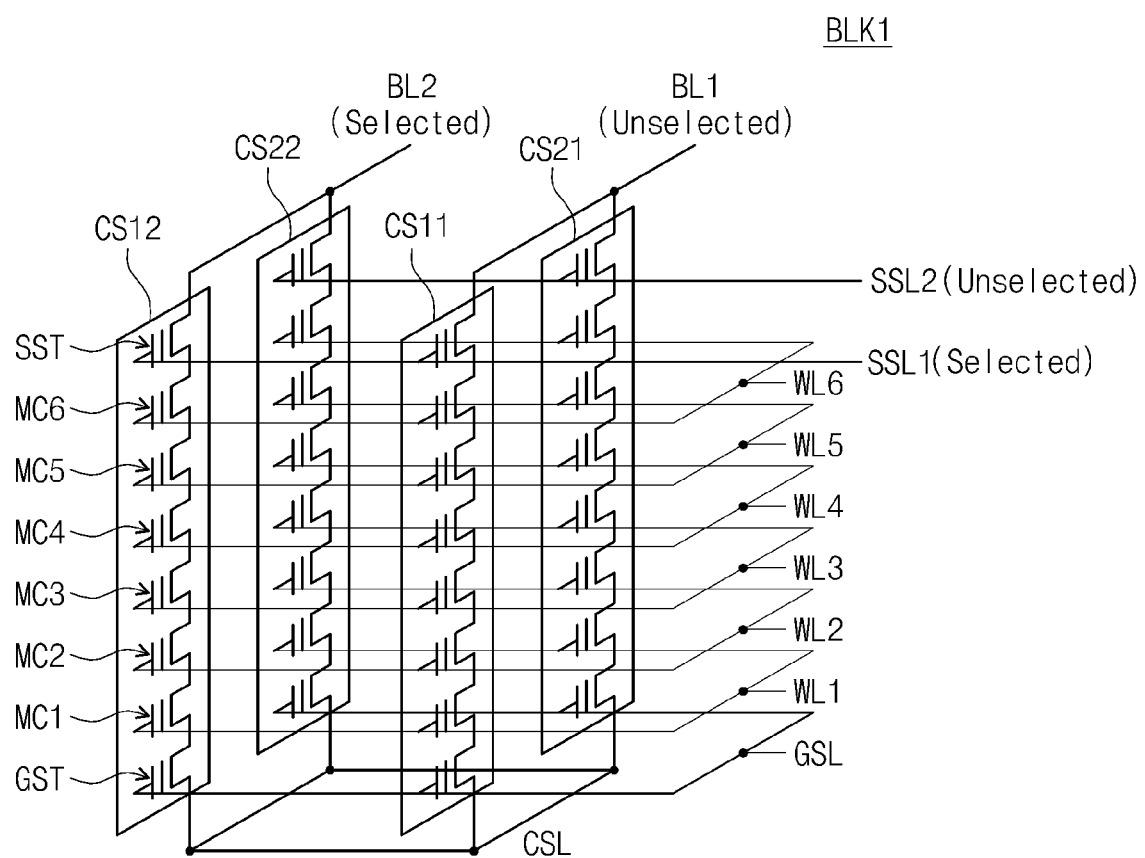
FIG. 19 is a diagram for describing a non-floated cell string in a selected memory block at a read operation.

FIG. 19 is a diagram for describing a non-floated cell string in a selected memory block at a read operation.

Referring to FIG. 19, the first string selection line SSL1 may be selected while the second string selection line SSL2 may be unselected. For example, the first string selection line SSL1 may be selected by applying a power supply voltage to the first string selection line SSL1, and the second string selection line SSL2 may be unselected by applying a ground voltage to the second string selection line SSL2. At reading, data may be read out via the first and second bit lines BL1 and BL2. With this condition, cell strings CS21 and CS22 may be isolated from the first and second bit lines BL1 and BL2, respectively.

At reading, a power supply voltage may be applied to a ground selection line GSL, so that ground selection transistors GST are turned on. This may enable all cell strings CS11, CS12, CS21, and CS22 to be connected with a common source line CSL. A voltage of the common source line CSL may be a ground voltage, for example. When driving signals DS1 to DS6 are applied to word lines WL1 to WL6, respectively, memory cells in the cell strings CS11, CS12, CS21, and CS22 may act as a capacitor. For example, each memory cell may act as a capacitor by supplying a ground voltage to a pillar corresponding to each cell string via the common source line CSL and applying driving signals to word lines, respectively.

In FIG. 19, square boxes marked by a solid line may represent cell strings CS11, CS12, CS21, and CS22 being not floated. Referring to FIGS. 18 and 19, the number of cell string (e.g., CS11, CS12, CS21, and CS22) being not floated at reading may be more than that (e.g., CS12) at programming.

Figure 20:
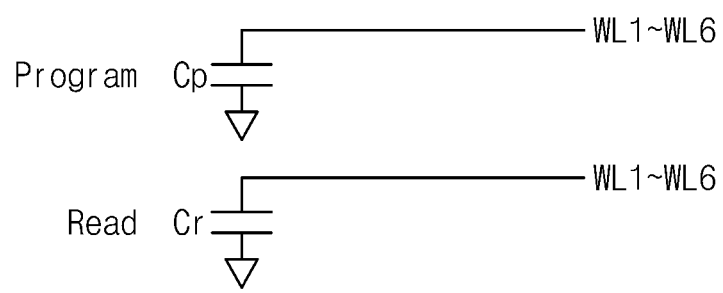
FIG. 20 is a diagram illustrating an equivalent capacitor of word lines at programming and an equivalent capacitor of word lines at reading.

FIG. 20 is a diagram illustrating an equivalent capacitor of word lines at programming and an equivalent capacitor of word lines at reading. As described with reference to FIGS. 18 and 19, the number of cell string floated at programming may be more than that at reading. This may mean that a capacitance value of a capacitor Cp of word lines at programming is less than that of a capacitor Cr of word lines at reading.

Figure 21:
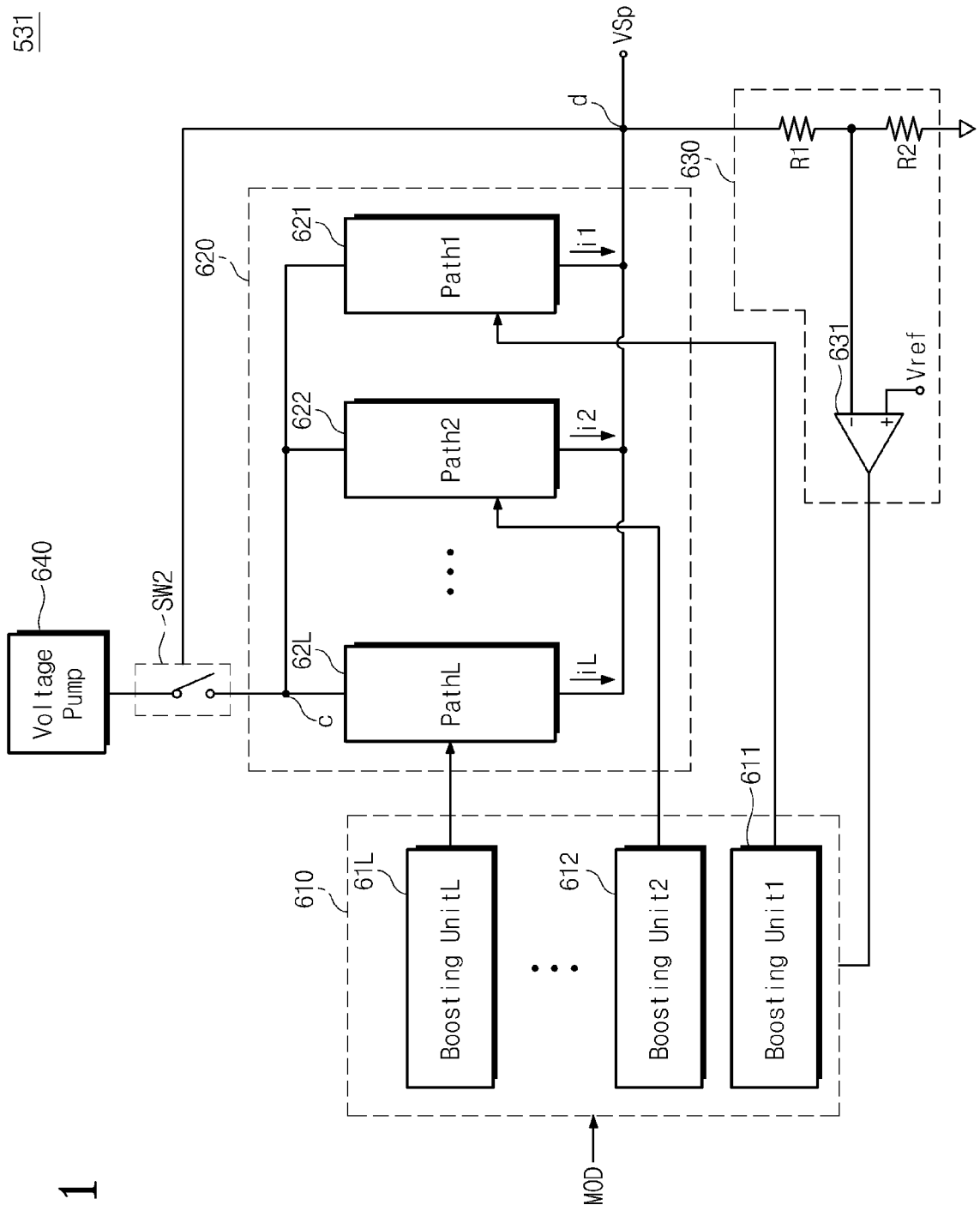
FIG. 21 is a block diagram illustrating one of the pass voltage generators in FIG. 16 according to example embodiments of inventive concepts.

FIG. 21 is a block diagram illustrating one of the pass voltage generators in FIG. 16 according to an example embodiments of inventive concepts. A pass voltage generator 531 in FIG. 21 may be configured the same that in FIG. 11 except that a boosting block 610 operates according to a mode signal MOD.

The boosting block 610 may include boosting units 611 to 61L. The boosting units 611 to 61L may correspond to current paths 621 to 62L, respectively. Each of the boosting units 611 to 61L may be activated or inactivated. The number of boosting units to be activated may be determined according to the mode signal MOD. An activated boosting unit may activate a corresponding current path. Accordingly, the number of current paths being activated may be determined according to the mode signal MOD.

A current path block 620 may include current paths 621 to 62L. The current path block 620 may receive a source voltage from a voltage pump 640 via the second switch SW2 and a node c. Currents may flow via activated current paths from the node c to a node d. A rising slope of a pass voltage signal VSp may be determined according to the number of activated current paths.

According to example embodiments, at least one of the first and second resistors R1 and R2 may be a variable resistor whose value is varied according to the control of control logic 580. A voltage level of the node d may be varied by adjusting a resistance value of at least one of the first and second registers R1 and R2. As a resistance value of at least one of the first and second registers R1 and R2 is adjusted, a pass voltage signal VSp having the first voltage level V1 (refer to FIG. 22) and a pass voltage signal VSp having the second voltage level V2 (refer to FIG. 22) may be provided.

Figure 22:
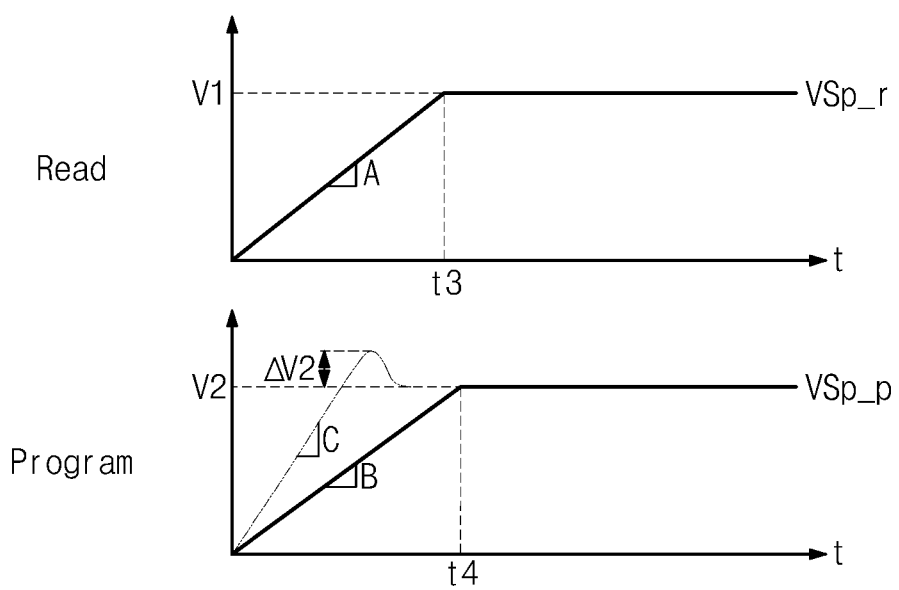
FIG. 22 is a diagram illustrating a voltage variation of a pass voltage signal at programming and reading.

FIG. 22 is a diagram illustrating a voltage variation of a pass voltage signal at programming and reading. A pass voltage signal may be provided as a driving signal of an unselected word line.

Referring to FIG. 22, a pass voltage signal VSp_r may increase along a rising slope of 'A' until the third time t3 from an applying time of the pass voltage signal VSp_r. At the third time t3, the pass voltage signal VSp_r may reach the first voltage level V1.

A capacitance value of a capacitor Cp (refer to FIG. 20) of word lines WL1 to WL6 at programming may be smaller than that of a capacitor Cr (refer to FIG. 20) of the word lines WL1 to WL6 at reading. It is assumed that the number of current paths used to generate the pass voltage signal VSp_p is identical to that used to generate the pass voltage signal VSp_r. With this assumption, the pass voltage signal VSp_p may be overshot due to a sharply increasing rising slope 'C'. After a voltage level of the pass voltage signal VSp_p reaches the second voltage V2, it may further increase by a specific voltage $\Delta V2$. This overshooting may make a threshold voltage of a memory cell of an unselected word line increase unintentionally. This may cause the electric field coupling (or, called the F-poly coupling) between adjacent cells.

With an example embodiments of inventive concepts, the number of current paths being activated at a read operation may be determined according to a mode signal MOD so as to be larger than that at a program operation. The number of current paths used to generate the pass voltage signal VSp_p may be adjusted so the pass voltage signal VSp_p does not overshot and has an appropriate rising slope (e.g., "B").

The pass voltage signal VSp_p may have a rising slope of "B". At the third time t3, the pass voltage signal VSp_p may reach the second voltage level V2. For example, the second voltage level V2 may be higher than the first voltage level V1.

A nonvolatile memory 500 may utilize an incremental step pulse programming (ISPP) scheme. That is, as a program voltage being increased stepwise is applied to a selected word line, selected memory cells may be programmed to have required threshold voltage levels. The program voltage being increased stepwise may be provided from a selection voltage generator 532.

One program loop may include applying a program voltage being increased stepwise and detecting whether selected memory cells are programmed to have required threshold voltage levels. A program operation of the nonvolatile memory 500 may be executed by iterations of program loops. At this time, a power supply voltage may be applied to a bit line corresponding to a memory cell detected to have a required threshold voltage level. On the other hand, a ground voltage may be applied to a bit line corresponding to a memory cell detected not to have a required threshold voltage level.

As described with reference to FIG. 18, at programming, when receiving a power supply voltage via a string selection line SSL and a power supply voltage via a bit line (e.g., BL1), a string selection transistor may be turned off. When receiving a power supply voltage via a string selection line SSL and a ground voltage via a bit line (e.g., BL2), a string selection transistor may be turned on. A cell string including a turned-off string selection transistor may be floated.

While each program loop is being executed, a cell string may be floated which includes a memory cell reaching a required threshold voltage level among selected memory cells. As a result, as program loops are iterated, the number of floated ones of cell strings each including a selected memory cell may increase.

As the number of floated cell strings increases, a capacitance value of a capacitor Cp of word lines WL1 to WL6 at programming may decrease. As the number of program loops increases, a capacitance value of an equivalent capacitor Cp of word lines WL1 to WL6 may decrease.

Whenever a program loop is executed, a voltage control circuit 540 may control a pass voltage generator 531 such that the number of current paths used to generate a pass voltage signal VSp decreases. According to example embodiments, the number of current paths used to generate a pass voltage signal VSp may be adjusted such that a rising slope of the pass voltage signal VSp provided whenever a program loop is executed is identical.

Figure 23:
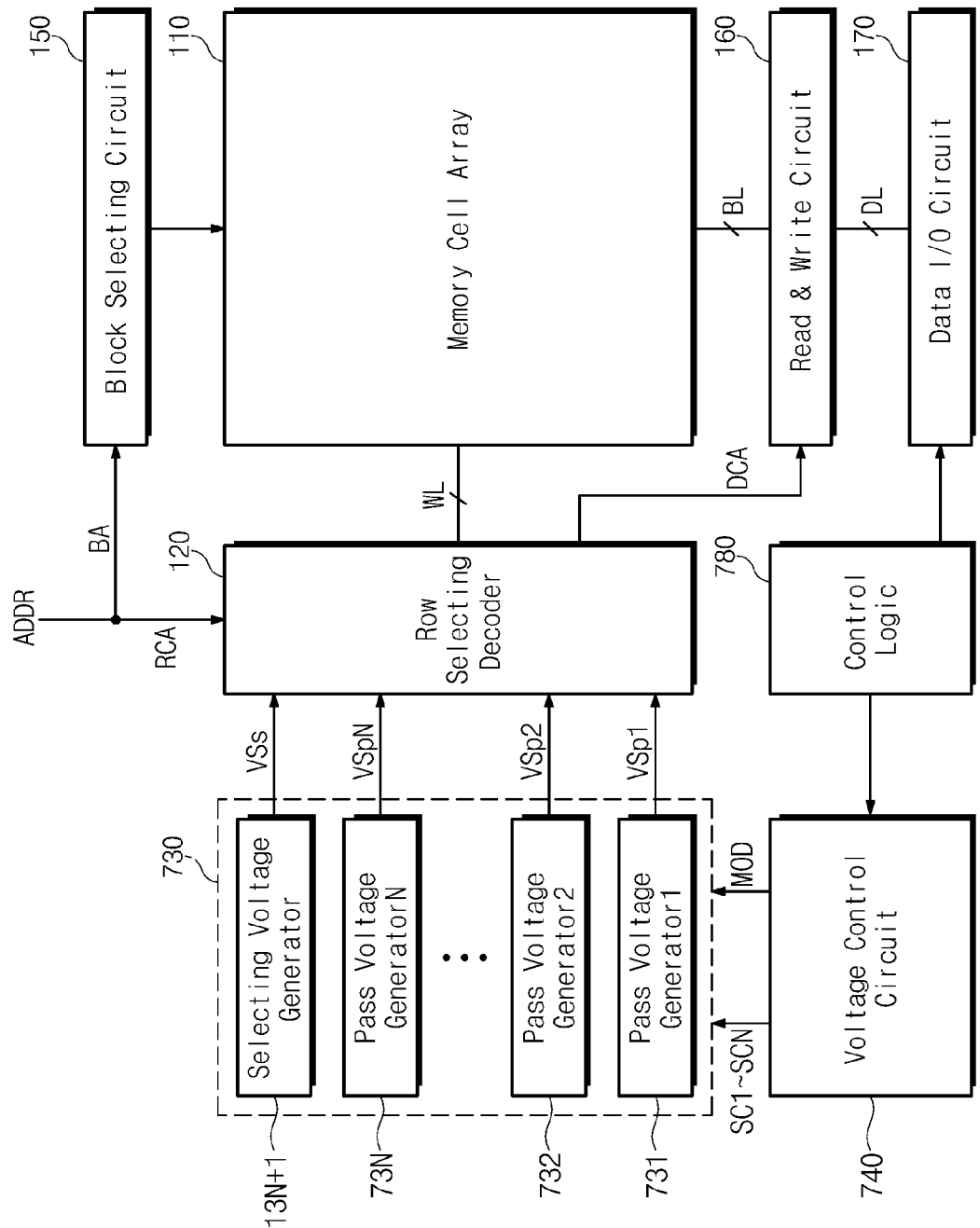
FIG. 23 is a block diagram illustrating a nonvolatile memory according to example embodiments of inventive concepts.

FIG. 23 is a block diagram illustrating a nonvolatile memory according to example embodiments of inventive concepts. Referring to FIG. 23, a nonvolatile memory 700 may be configured the same as that in FIG. 1 except for a voltage generating circuit 730, a voltage control circuit 740, and control logic 780. Accordingly, the description of like elements is thus omitted.

The voltage control circuit 740 may operate responsive to the control of the control logic 780. The voltage control circuit 740 may receive mode information from the control logic 780. The voltage control circuit 740 may generate a mode signal MOD in response to the mode information from the control logic 780.

Pass voltage generators 731 to 73N may receive the mode signal MOD from the voltage control circuit 740. The pass voltage generators 731 to 73N may receive slope control signals SC1 to SCN from the voltage control circuit 740.

The pass voltage generators 731 to 73N may generate pass voltage signals VSp1 to VSpN, respectively. Each of the pass voltage generators 731 to 73N may generate a corresponding pass voltage signal using current paths included therein.

In each pass voltage generator, the number of current paths used at programming and the number of current paths used at reading may be determined according to the mode signal MOD. The number of current paths used at programming may be different from that used at reading The number of current paths used in each pass voltage generator may be adjusted according to the slope control signals SC1 to SCN such that the pass voltage signals VSp1 to VSpN have the same rising slope. That is, the number of current paths used in each pass voltage generator may be adjusted such that word line loading times of unselected word lines are identical to one another.

Figure 24:
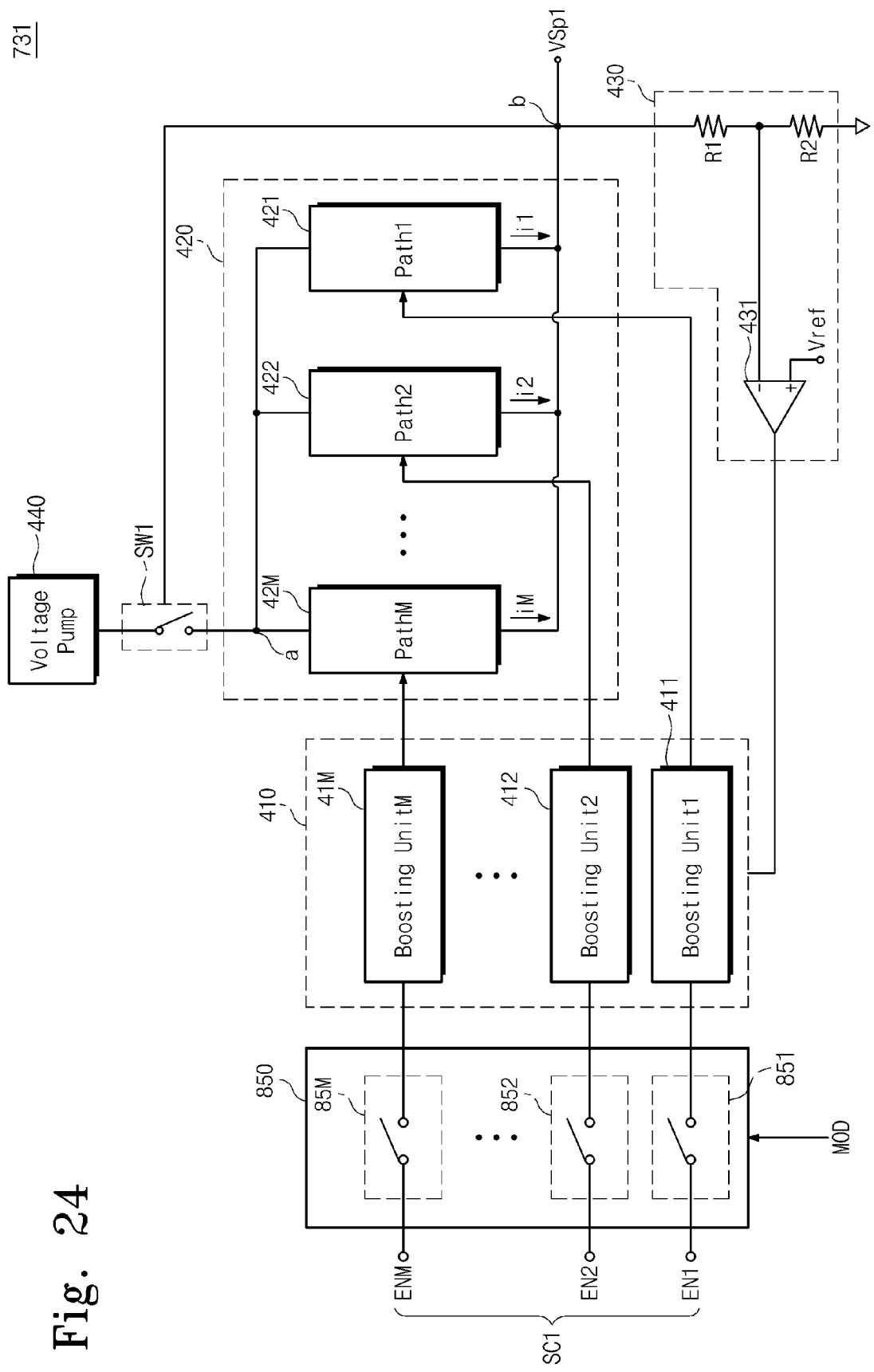
FIG. 24 is a block diagram illustrating one of the pass voltage generators in FIG. 23.

FIG. 24 is a block diagram illustrating one of the pass voltage generators in FIG. 23. A pass voltage generator 731 may be configured the same as that in FIG. 11 except that a switching block 850 is further provided, and duplication description of like elements therefore is omitted.

The switching block 850 may be coupled with a boosting block 810 and may include enable switches 851 to 85M connected with boosting units 411 to 41M, respectively.

A slope control signal SC1 may include enable signals EN1 to ENM. The enable switches 851 to 85M in the switching block 850 may receive the enable signals EN1 to ENM, respectively.

The enable switches 851 to 85M may be turned on or off according to a mode signal MOD. That is, each of the enable switches 851 to 85M may transfer a corresponding enable signal input according to the mode signal MOD into a corresponding boosting unit.

The boosting units 411 to 41M may be activated according to output signals of the enable switches 851 to 85M, respectively. That is, the boosting units 411 to 41M may be activated according to the enable signals EN1 to ENM and the mode signal MOD. An activated boosting unit may activate a current path connected with the activated boosting unit. As a result, current paths 421 to 42M may be activated according to enable signals EN1 to ENM and the mode signal MOD.

Each of pass voltage generators 731 to 73N may be controlled such that the number of current paths activated at programming is less than that at reading and pass voltage signals VSp1 to VSpN have the same rising slope.

Figure 25:
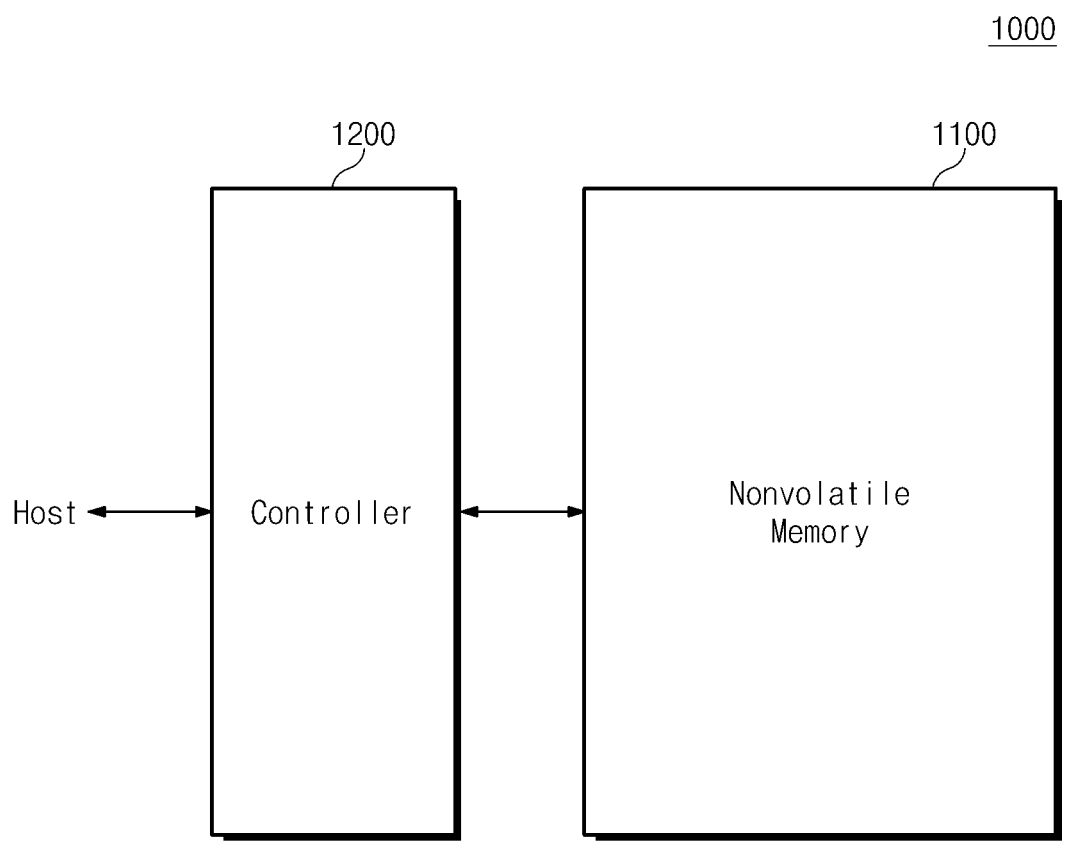
FIG. 25 is a block diagram illustrating a memory system according to example embodiments of inventive concepts.

FIG. 25 is a block diagram illustrating a memory system according to an example embodiments of inventive concepts. Referring to FIG. 25, a memory system 1000 may include a nonvolatile memory 1100 and a controller 1200.

The nonvolatile memory 1100 may be configured as described in FIGS. 1 to 24.

The controller 1200 may be coupled with a host and the nonvolatile memory 1100. The controller 1200 may be configured to access the nonvolatile memory 1100 in response to a request from the host. The controller 1200 may be configured to control read, program, erase, and background operations of the nonvolatile memory 1100, for example. The controller 1200 may be configured to provide an interface between the nonvolatile memory 1100 and the host. The controller 1200 may be configured to drive firmware for controlling the nonvolatile memory 1100.

According to example embodiments, the controller 1200 may further include constituent elements such as a RAM, a processing unit, a host interface, and a memory interface. The RAM may be used as at least one of a working memory of the processing unit, a cache memory between the nonvolatile memory 1100 and the host or a buffer memory between the nonvolatile memory 1100 and the host. The processing unit may control an overall operation of the controller 1200.

The host interface may include the protocol for executing data exchange between the host and the controller 1200. For example, the host interface may communicate with an external device (e.g., the host) via at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and an IDE (Integrated Drive Electronics) protocol. The memory interface may interface with the nonvolatile memory 1100. The memory interface may include a NAND interface or a NOR interface.

The memory system 1000 may further include an ECC block. The ECC block may be configured to detect and correct an error of data read from the nonvolatile memory 1100 using ECC. The ECC block may be provided as an element of the controller 1200 or as an element of the nonvolatile memory 1100.

The controller 1200 and the nonvolatile memory 1100 may be integrated in a single semiconductor device. The controller 1200 and the nonvolatile memory 1100 may be integrated in a single semiconductor device to form a memory card. For example, the controller 1200 and the nonvolatile memory device 1100 may be integrated in a single semiconductor device to form a memory card such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, or the like, but example embodiments are not limited thereto.

The controller 1200 and the nonvolatile memory 1100 may be integrated in a single semiconductor device to form a solid state drive (SSD). The SSD may include a storage device configured to store data in a semiconductor memory. If the memory system 1000 is used as the SSD, it is possible to improve an operating speed of a host coupled with the memory system 1000.

According to example embodiments, the memory system 1000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

According to example embodiments, a nonvolatile memory 1100 or a memory system 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like, but example embodiments are not limited thereto.

Figure 26:
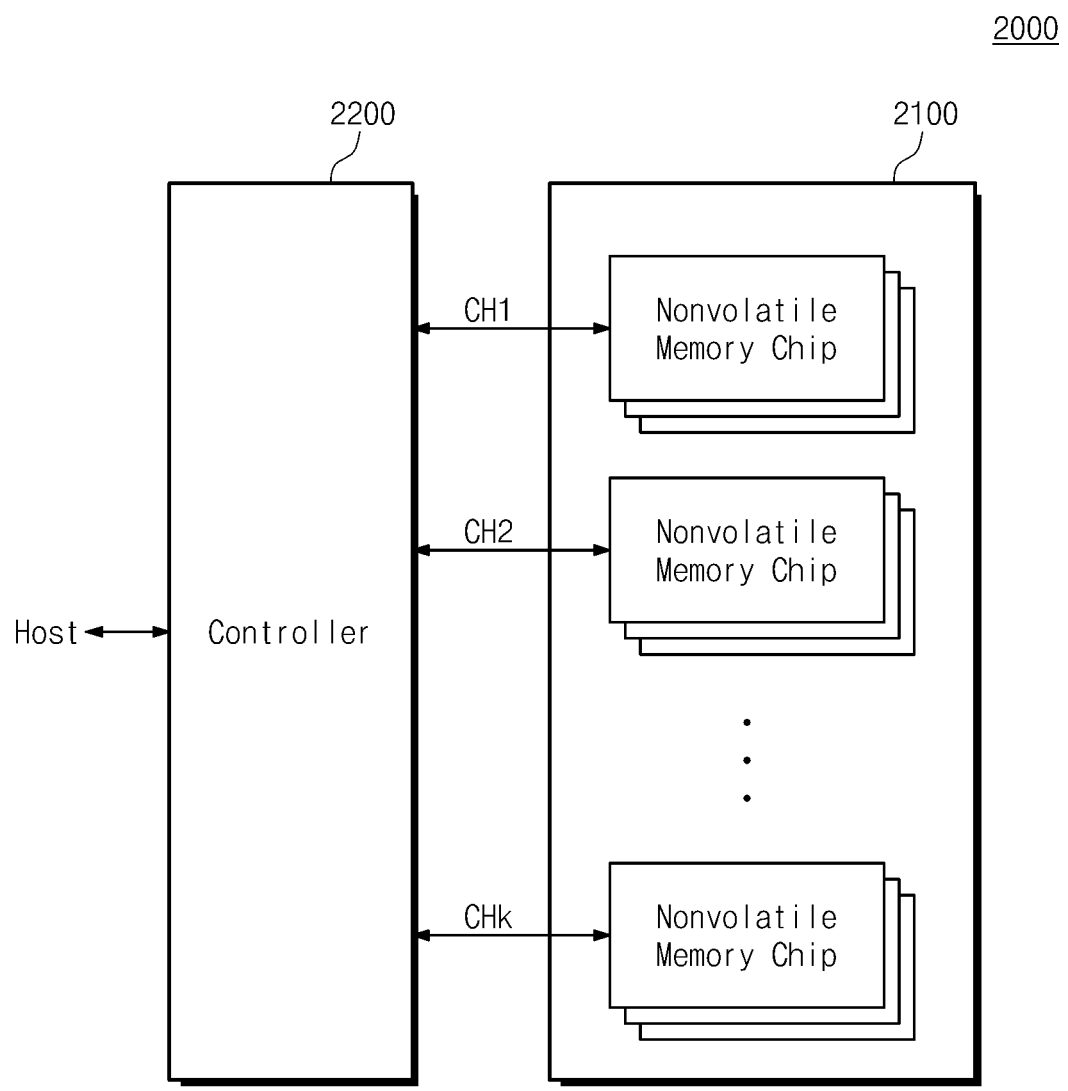
FIG. 26 is a block diagram illustrating an application of a memory system in FIG. 25.

FIG. 26 is a block diagram illustrating an application of a memory system in FIG. 25. Referring to FIG. 26, a memory system 2000 may include a nonvolatile memory 2100 and a controller 2200. The nonvolatile memory 2100 may include a plurality of nonvolatile memory chips. The plurality of nonvolatile memory chips may be classified into a plurality of groups. Nonvolatile memory chips in each group may communicate with the controller 2200 via a common channel. In FIG. 26, a plurality of memory chips may communicate with the controller 2200 via plural channels CH1 to CHk. Each nonvolatile memory chip may be configured to operate the same as one of nonvolatile memories 100, 500, and 700 described in FIGS. 1, 16, and 23.

As illustrated in FIG. 26, one channel may be connected with a plurality of nonvolatile memory chips. However, the memory system 2000 may be modified such that one channel is connected with one nonvolatile memory chip.

Figure 27:
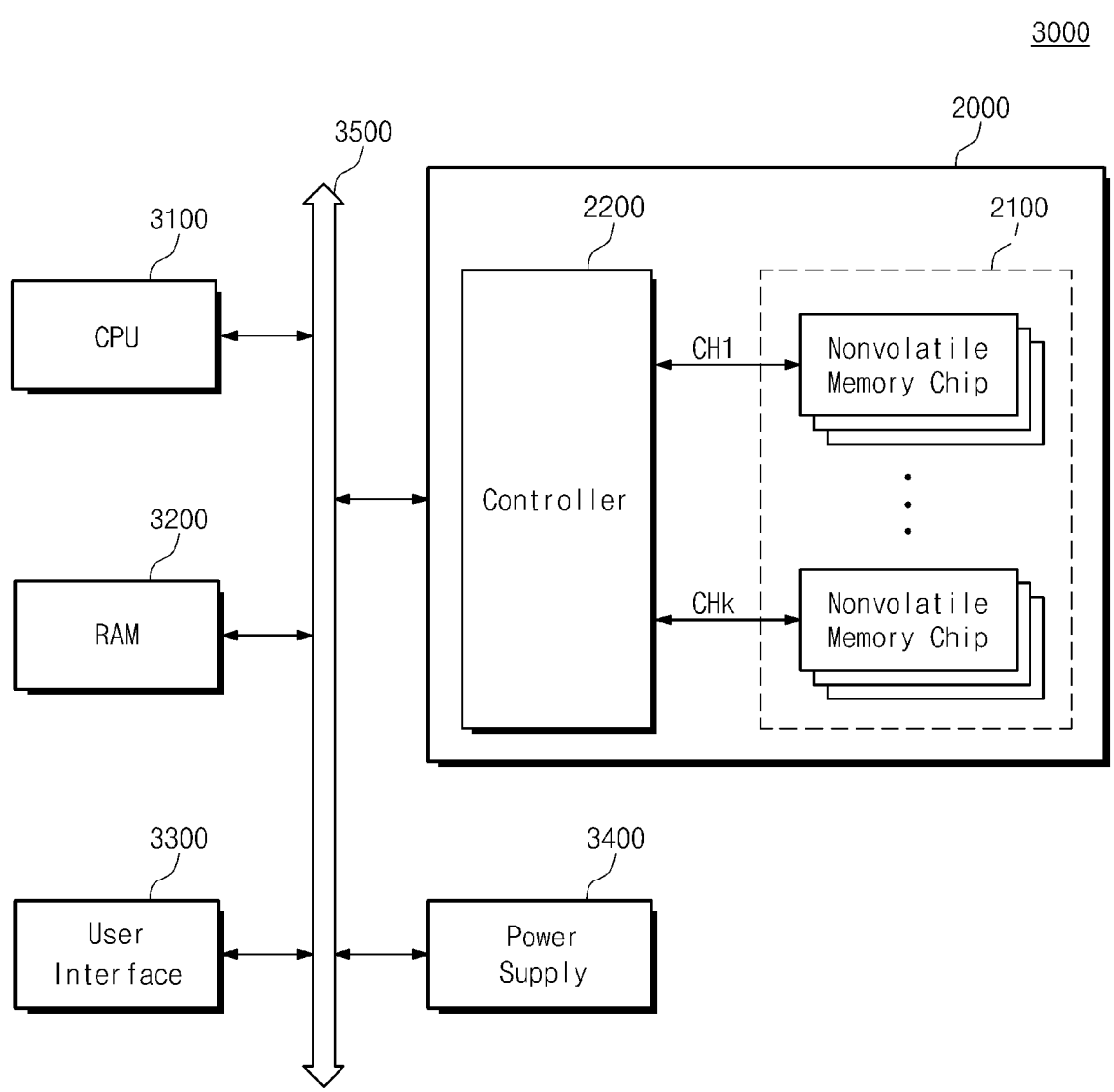
FIG. 27 is a block diagram illustrating a computing system including a memory system described in FIG. 26.

FIG. 27 is a block diagram illustrating a computing system including a memory system described in FIG. 26. Referring to FIG. 27, a computing system 3000 may include a CPU 3100, a RAM 3200, a user interface 3300, a power supply 3400, and a memory system 2000.

The memory system 2000 may be electrically connected with the CPU 3100, the RAM 3200, the user interface 3300, and the power supply 3400 via a system bus 3500. Data provided via the user interface 3300 or processed by the CPU 3100 may be stored in the memory system 2000.

As illustrated in FIG. 27, a nonvolatile memory 2100 may be connected with a system bus 3500 via a controller 2200. However, the nonvolatile memory 2100 can be connected directly with the system bus 3500. At this time, a function of the controller 2200 may be executed by the CPU 3100.

The memory system 2000 in FIG. 27 may be a memory system described in FIG. 26. However, the memory system 2000 can be replaced with a memory system 1000 in FIG. 25. According to example embodiments, the computing system 3000 may be configured to include all memory systems 1000 and 2000 described in FIGS. 26 and 27. While some example embodiments have been particularly shown and described, it will be understood by one of ordinary skill in the art that variations in form and detail may be made therein without departing from the spirit and scope of the claims.

What is claimed is:

1. A nonvolatile memory device comprising:
   a memory cell array including a plurality of memory cells stacked on a substrate;
   a plurality of word lines connected with the memory cell array;
   a plurality of pass voltage generators,
   the pass voltage generators each including a plurality of current paths, and
   the pass voltage generators configured to generate pass driving signals applied to unselected word lines of the plurality of word lines; and
   a voltage control circuit configured to control rising slopes of the pass driving signals generated from the plurality of pass voltage generators, based on adjusting the number of current paths in each pass voltage generator used to generate each pass driving signal.

2. The nonvolatile memory device of claim 1, wherein the voltage control circuit is configured to adjust the number of current paths used to generate each of the pass driving signals such that the pass driving signals have the same rising slope.

3. The nonvolatile memory device of claim 1, wherein the pass driving signals have equal voltage levels when the pass driving signals are at a stabilization state.

4. The nonvolatile memory device of claim 1, wherein each of the pass voltage generators includes the plurality of current paths connected in parallel.

5. The nonvolatile memory device of claim 1, wherein
   the plurality of word lines include a first word line and a second word line sequentially stacked on the substrate, and
   the voltage control circuit is configured to control the plurality of pass voltage generators so a number of current paths used to generate a pass driving signal of the second word line is more than a number of current paths used to generate a pass driving signal of the first word line when the first word line and the second word line are unselected word lines.

6. The nonvolatile memory device of claim 1, wherein
   the plurality of word lines include first to fourth word lines sequentially stacked on the substrate, and
   the voltage control circuit is configured to control the plurality of pass voltage generators so a number of current paths used to generate a pass driving signal of the second word line is more than a number of current paths used to generate a pass driving signal of the first word line when the first word line and the second word line are unselected word lines, and
   the voltage control circuit is configured to control the plurality of pass voltage generators so a number of current paths used to generate a pass driving signal of the fourth word line is more than a number of current paths used to generate a pass driving signal of the third word line when the third word line and the fourth word line are unselected word lines.

7. The nonvolatile memory device of claim 1, wherein
   the current paths in each of the pass voltage generators are connected in parallel between a first node receiving a source voltage and a second node,
   each of the pass voltage generators is configured to activate or inactivate at least one of the current paths according to enable signals received from the voltage control circuit, and
   when currents flow via activated current paths in each pass voltage generator, each pass voltage generator is configured to transfer a voltage to the second node as one the pass driving signals.

8. The nonvolatile memory device of claim 1, wherein
   each of the pass voltage generators is configured to generate a first pass voltage signal applied to at least one of the unselected word lines at a program operation and a second pass voltage signal applied to at least one of the unselected word lines at a read operation, the voltage control circuit is configured to control rising slopes of the first and second pass voltage signals, based on adjusting the number of current paths used to generate each of the first and second pass voltage signals, and the voltage control circuit is configured to control the plurality of pass voltage generators so the number of current paths used to generate the first pass voltage signal is less than the number of current paths used to generate the second pass voltage signal.

9. The nonvolatile memory device of claim 1, further comprising:

a selection voltage generator configured to generate a select driving signal applied to a selected word line of the plurality of word lines; and a row selecting circuit configured to transfer an output signal of the selection voltage generator to the selected word line and to transfer output signals of the pass voltage generators to the unselected word lines, respectively.

10. A nonvolatile memory device comprising:

a memory cell array including a plurality of memory cells stacked on a substrate;

a plurality of word lines connected with the memory cell array;

a pass voltage generator including a plurality of current paths, the pass voltage generator configured to generate a first pass voltage signal applied to at least one unselected word line of the plurality of word lines at a program operation, and the pass voltage generator configured to generate a second pass voltage signal applied to the at least one unselected word line of the plurality of word lines at a read operation; and a voltage control circuit configured to control rising slopes of the first and second pass voltage signals, based on adjusting the number of current paths in the pass voltage generator used to generate the first and second pass voltage signals.

11. The nonvolatile memory device of claim 10, wherein voltage control circuit is configured to control the pass voltage generator so the number of current paths used to generate the first pass voltage signal is less than the number of current paths used to generate the second pass voltage signal.

12. The nonvolatile memory device of claim 10, further comprising:

a control logic configured to control the program operation and the read operation, wherein the voltage control circuit is configured to provide the pass voltage generator with a mode signal corresponding to one of the program and read operations, the voltage control circuit generating the mode signal according to a control of the control logic.

13. The nonvolatile memory device of claim 12, wherein the pass voltage generator is configured to adjust the number of current paths used to generate each of the first and second pass voltage signals according to the mode signal.

14. The nonvolatile memory device of claim 13, wherein the plurality of current paths of the pass voltage generator are connected in parallel between a first node and a second node, the pass voltage generator is configured to activate the parallel-connected current paths according to the mode signal, and the first node is configured to receive a source voltage and to transfer a voltage to the second node when a current flowing via activated current paths is provided as one of the first and second pass voltage signals.

15. The nonvolatile memory device of claim 10, further comprising:

a selection voltage generator configured to generate a program voltage to be applied during the program operation, wherein the program operation includes a plurality of program loops and the program voltage increases stepwise at iteration of the program loops, and if a program loop number increases, the voltage control circuit is configured to control the pass voltage generator such that the number of current paths used to generate the first pass voltage signal decreases.

16. A nonvolatile memory device comprising:

at least one cell string containing first to $n^{th}$ memory cells stacked on a substrate;

a plurality of word lines connected to the at least one cell string;

a voltage generating circuit configured to apply pass driving signals to the first to $n^{th}$ memory cells of the at least one cell string via the plurality of word lines, the voltage generating circuit including a plurality of pass voltage generators, each pass voltage generator containing a plurality of current paths and configured to generate at least one of the pass driving signals applied to the first to $n^{th}$ memory cells; and a voltage control circuit configured to control rising slopes of the pass driving signals applied to the first to $n^{th}$ memory cells, based on adjusting the number of current paths in each pass voltage generator used to generate each pass driving signal.

17. The nonvolatile memory device of claim 16, wherein the voltage control circuit is configured to control the voltage generating circuit so a number of current paths used in one of the pass voltage generators to generate a pass driving signal applied to the first memory cell is less than a number of current paths used in another of the pass voltage generators to generate a pass driving signal applied to another of the first to $n^{th}$ memory cells of the at least one cell string.

18. The nonvolatile memory device of claim 16, wherein the voltage control circuit is configured to provide a mode signal to the voltage generating circuit, the mode signal corresponds to one of a read operation and a program operation, each pass voltage generator is configured to generate a first pass driving signal when the mode signal corresponds to the read operation, and each pass voltage generator is configured to generate a second pass driving signal when the mode signal corresponds to the program operation.

19. The nonvolatile memory device of claim 16, wherein the voltage generating circuit further includes a selection voltage generator, and the selection voltage generator is configured to generate a select driving signal applied to a selected word line of the plurality of word lines.

20. A memory system comprising:

a controller coupled to the nonvolatile memory device of claim 16.

* * * * *